(12) United States Patent
Pedersen et al.

(10) Patent No.: US 7,352,610 B1
(45) Date of Patent: Apr. 1, 2008

(54) VOLATILE MEMORY ELEMENTS WITH SOFT ERROR UPSET IMMUNITY FOR PROGRAMMABLE LOGIC DEVICE INTEGRATED CIRCUITS

(75) Inventors: Bruce B. Pedersen, Sunnyvale, CA (US); Irfan Rahim, San Jose, CA (US); Jeffrey T Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 144 days.

(21) Appl. No.: 11/295,815

(22) Filed: Dec. 6, 2005

(51) Int. Cl.
*G11C 11/00* (2006.01)
(52) U.S. Cl. .................. 365/154; 365/156; 365/175; 257/104; 257/106
(58) Field of Classification Search ................ 365/154, 365/156, 175; 257/104, 106
See application file for complete search history.

(56) References Cited

U.S. PATENT DOCUMENTS

| | | | |
|---|---|---|---|
| 4,805,148 A * | 2/1989 | Diehl-Nagle et al. ....... | 365/154 |
| 6,768,355 B1 | 7/2004 | Henry et al. | |
| 6,775,178 B2 * | 8/2004 | Liu et al. .................... | 365/154 |
| 7,233,518 B2 * | 6/2007 | Liu ............................ | 365/156 |
| 2005/0259462 A1 * | 11/2005 | Wood ......................... | 365/154 |

OTHER PUBLICATIONS

L.R. Rocket, Jr., "Simulated SEU Hardened Scaled CMOS SRAM Cell Design Using Gated Resistors" IEEE Transactions. on Nuclear Science, vol. 39, No. 5, Oct. 1992, pp. 1532-1541.
H.T. Weaver et al. "Soft Error Protection Using Asymmetric Response Latches", IEEE Transactions on Electron Devices, vol. 38, No. 6, Jun. 1991, pp. 1555-1557.
J.L. Andrews et al., "Single Event Error Immune CMOS RAM", IEEE Transactions on Nuclear Science, vol. NS-29, No. 6, Dec. 1982, pp. 2040-2043.

* cited by examiner

*Primary Examiner*—Anh Phung
*Assistant Examiner*—Toan Le
(74) *Attorney, Agent, or Firm*—G. Victor Treyz

(57) ABSTRACT

Memory elements are provided that are immune to soft error upset events when subjected to high-energy atomic particle strikes. The memory elements have nonlinear high-impedance two-terminal elements that restrict the flow of discharge currents during a particle strike. By lengthening the switching speed of the memory elements, the presence of the nonlinear high-impedance two-terminal elements prevents the states of the memory elements from flipping during discharge transients. The nonlinear high-impedance two-terminal elements may be formed from polysilicon p-n junction diodes, Schottky diodes, and other semiconductor structures. Data loading circuitry is provided to ensure that memory element arrays using the nonlinear high-impedance two-terminal elements can be loaded rapidly.

15 Claims, 48 Drawing Sheets

VOLATILE MEMORY ELEMENTS WITH SOFT ERROR UPSET IMMUNITY FOR PROGRAMMABLE LOGIC DEVICE INTEGRATED CIRCUITS

BACKGROUND

This invention relates to volatile memory elements, and more particularly, to volatile memory elements that demonstrate soft error upset immunity for integrated circuits such as programmable logic devices.

Integrated circuits often contain volatile memory elements. Typical volatile memory elements are based on cross-coupled inverters (latches). A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. Volatile memory elements are also used in programmable logic device integrated circuits.

Volatile memory elements are subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0".

Upset events in an integrated circuit corrupt the date stored in the memory elements and can have serious repercussions for system performance. In certain system applications such as remote installations of telecommunications equipment, it is extremely burdensome to repair faulty equipment. Unless programmable logic devices and other integrated circuits demonstrate good immunity to soft error upset events, they will be unsuitable for these types of applications.

It would therefore be desirable to be able to improve the soft error upset performance of volatile memory elements in integrated circuits such as programmable logic device integrated circuits.

SUMMARY

In accordance with the present invention, memory elements are provided that are immune to soft error upset events. Soft error upset events arise from atomic particle strikes and give rise to brief discharge current transients that can discharge nodes in a memory element. The memory elements in accordance with the invention have nonlinear high-impedance two-terminal elements that lengthen the switching times of the memory elements. By ensuring that the memory elements switch more slowly than the discharge current transients, the memory elements are provided with immunity to soft error upset events.

The nonlinear high-impedance two-terminal elements can be formed from diodes and other nonlinear elements. Diode-based structures that may be used for the nonlinear high-impedance two-terminal elements include forward-biased diodes, reverse-biased diodes, back-to-back diodes with a common cathode, back-to-back diodes with a common anode, and structures with more than two diodes. The diodes may be p-n junction diodes with p-type and n-type doped regions, p-n junction diodes with p-type and n-type doped regions and an intervening undoped semiconductor region, or Schottky diodes. Non-diode structures that may be used include structures with p-type doped regions separated by an undoped semiconductor region and n-type doped regions separated by an undoped semiconductor region. Nonlinear high-impedance two-terminal elements formed from p-n junction diodes may be formed from polysilicon. The polysilicon in a p-n junction diode may be part of the same layer that is used to form a polysilicon gate for a metal-oxide-semiconductor transistor.

Memory elements may be based on cross-coupled inverters. The inverters may each have an n-channel metal-oxide-semiconductor (NMOS) transistor and a p-channel metal-oxide-semiconductor (PMOS) transistor or may have an NMOS transistor and a load resistor. The nonlinear high-impedance two-terminal elements may be located adjacent to the outputs of the inverters. In this type of configuration, two nonlinear high-impedance two-terminal elements provide soft error upset protection for both of the cross-coupled inverters. Due to layout and real estate constraints, it may be preferable to use nonlinear high-impedance two-terminal elements that are located adjacent to one or both of the gates of the NMOS and PMOS transistors in the inverters.

Because the nonlinear high-impedance two-terminal elements slow the switching speed of the memory elements, it may be desirable to provide memory element data loading circuitry that loads multiple sets of memory elements in parallel. With one suitable arrangement, an array of memory elements is divided into multiple banks. Each bank of memory elements is provided with an associated set of latches. Each set of latches is provided with corresponding data in sequence. While data is being provided to the latches associated with one bank of memory elements, the latches associated with another bank of memory elements load data into memory elements in that bank. In this way the memory elements can be loaded in parallel using time division multiplexing, which increases data loading throughput.

Further features of the invention, its nature and various advantages will be more apparent from the accompanying drawings and the following detailed description of the preferred embodiments.

DETAILED DESCRIPTION

The present invention relates to integrated circuit memory elements that are resistant to soft error upset events and to methods for using such memory elements. The invention also relates to integrated circuits containing memory arrays formed from the memory elements. These integrated circuits may be memory chips, digital signal processing circuits with memory arrays, microprocessors, application specific integrated circuits with memory arrays, programmable logic device integrated circuits in which memory elements are used for configuration memory, or any other suitable integrated circuit. For clarity, the present invention will sometimes be described in the context of programmable logic device integrated circuits.

Figure 1:
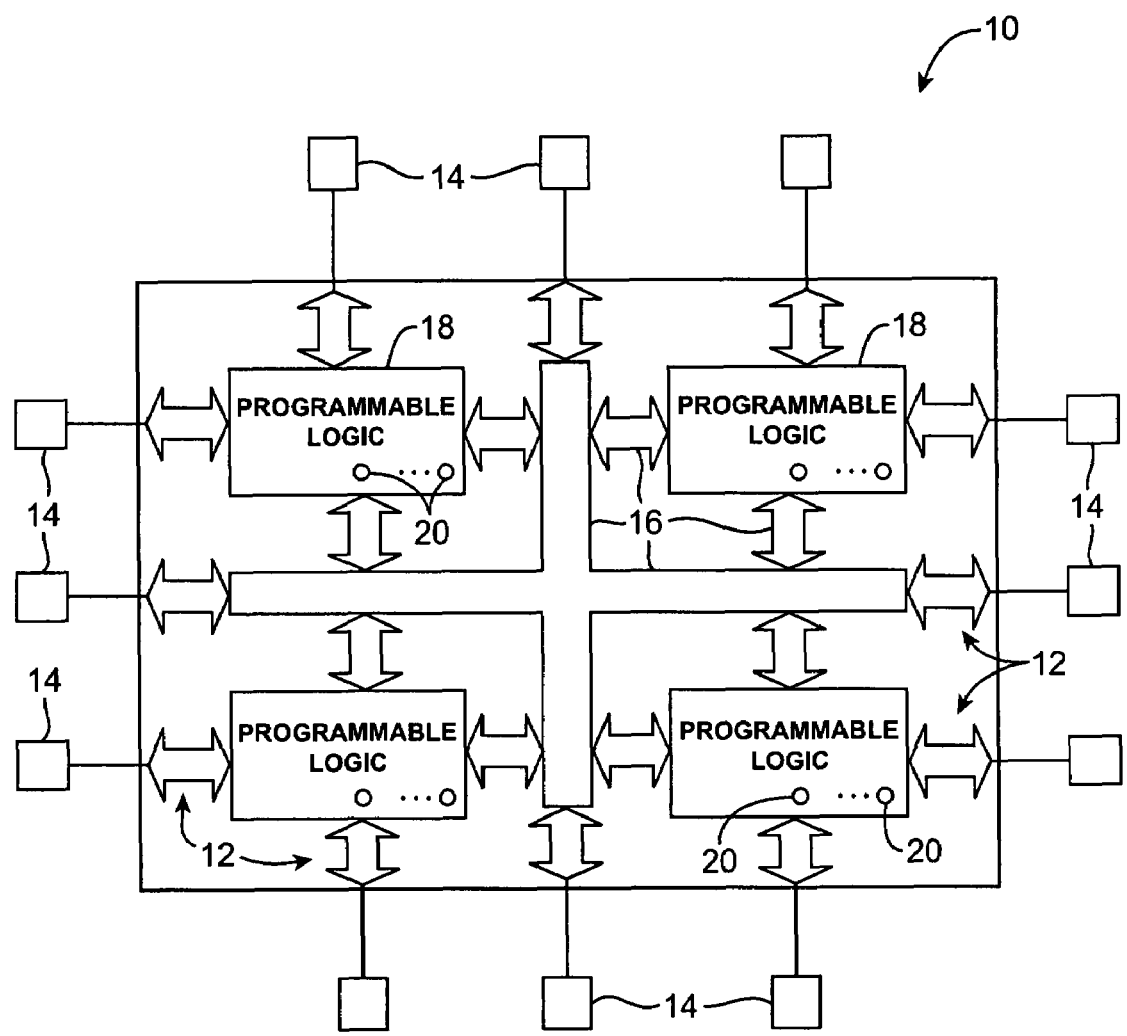
FIG. 1 is a diagram of an illustrative programmable logic device integrated circuit in accordance with the present invention.

An illustrative programmable logic device 10 in accordance with the present invention is shown in FIG. 1.

Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

On integrated circuits such as memory chips, memory elements 20 perform the functions of static random-access memory (RAM) cells and are sometimes referred to as SRAM cells. In the context of programmable logic device integrated circuits, the memory elements store configuration data and are therefore sometimes referred to as configuration random-access memory (CRAM) cells.

The memory elements may be loaded from an external erasable-programmable read-only memory and control chip via pins 14 and input/output circuitry 12. The loaded memory elements 20 provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 are generally arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 selectively control portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
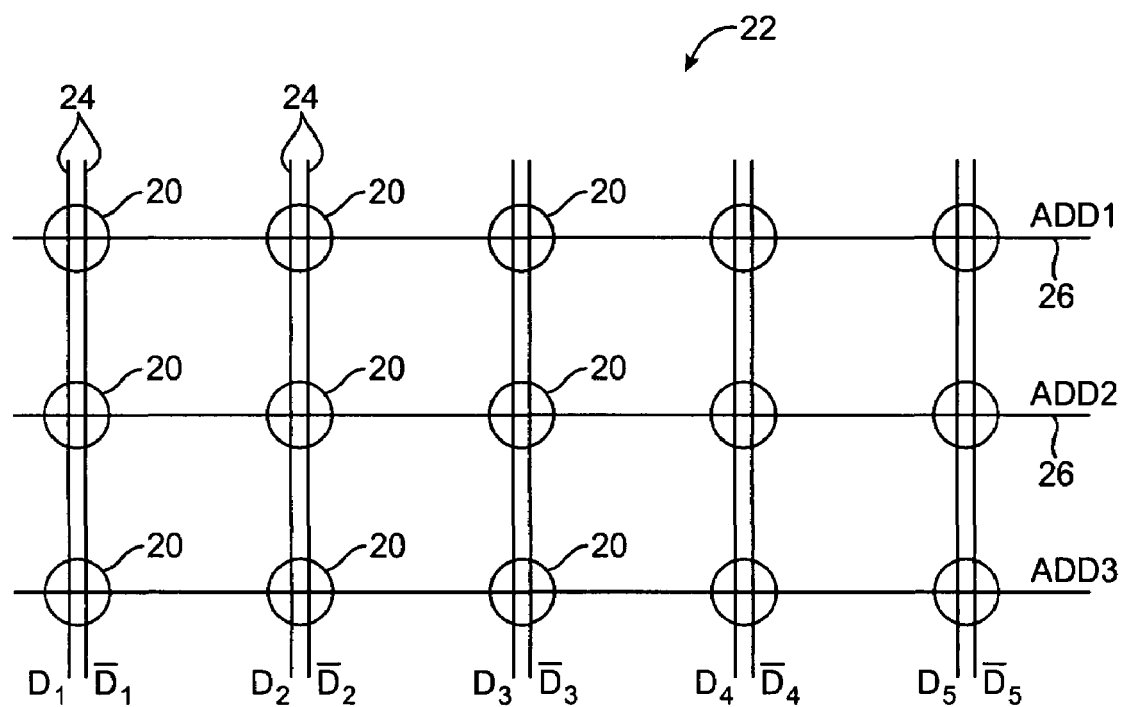
FIG. 2 is a diagram of an illustrative array of memory elements in accordance with the present invention.

When memory elements 20 are arranged in an array, horizontal and vertical conductors and associated loading circuitry may be used to load the memory elements with configuration data. Any suitable memory array architecture may be used to load an array of memory elements 20. One suitable arrangement is shown in FIG. 2. In the example of FIG. 2, memory array 22 is loaded using data lines 24 and address lines 26. Data lines 24 are provided in pairs—an uninverted data line and its complement (shown as D and D– bar in FIG. 2). Each column of data lines has a different subscript (i.e., $D_2$ corresponds to the uninverted data line 26 in the second column of memory array 22). The address lines 26 are labeled ADD1, ADD2, . . . . During loading, configuration data is placed on data lines 24 and address lines 26 are used to control which row of memory elements 20 is being loaded.

Figure 3:
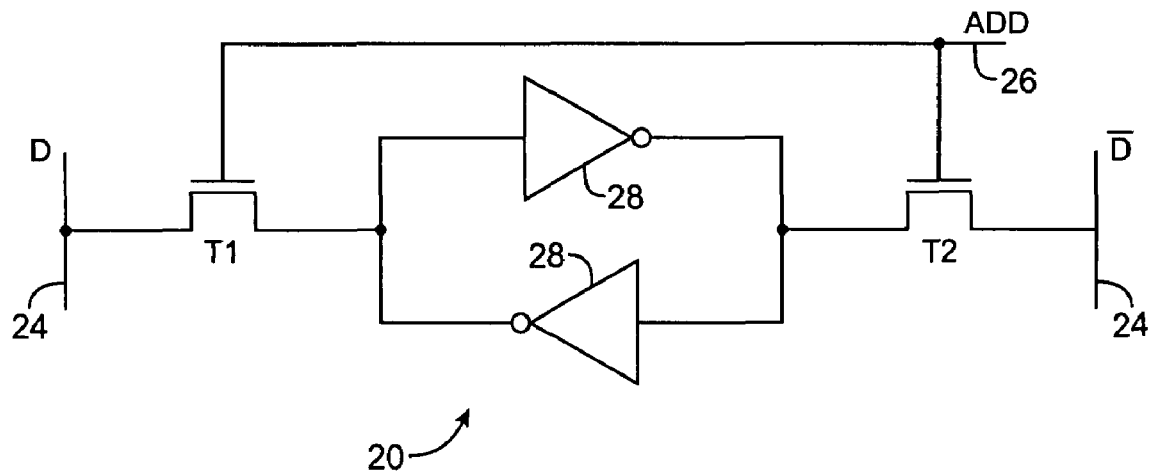
FIG. 3 is a diagram of an illustrative memory array architecture using a data line, a complement of the data line, and an address line to load memory elements in accordance with the present invention.

FIG. 3 shows an illustrative memory element architecture in which two transistors T1 and T2 are used to load configuration data into memory element 20. This illustrative memory element architecture may be used in an array of the type shown in the example of FIG. 2. As shown in FIG. 3, the memory element 20 contains two cross-coupled inverters 28 (latches). This is a stable circuit for storing data bits.

To load data into memory element 20 using the architecture of FIG. 3, data is applied to the data lines 24. The memory element 20 is then addressed by asserting the desired address line 26 in the array. In the example of FIG. 3, address line ADD is asserted by taking address line ADD high (i.e., to a logic "1" value). This turns on transistors T1 and T2 and electrically connects the data lines 24 to the memory element. The data that is present on the data lines 24 is loaded into the memory element 20. Data is generally loaded into multiple memory elements 20 in parallel, by using an address line 26 to address an entire memory array row. After loading is complete, the address line 26 is deasserted. The loaded data is retained in the memory element 20.

Figure 4:
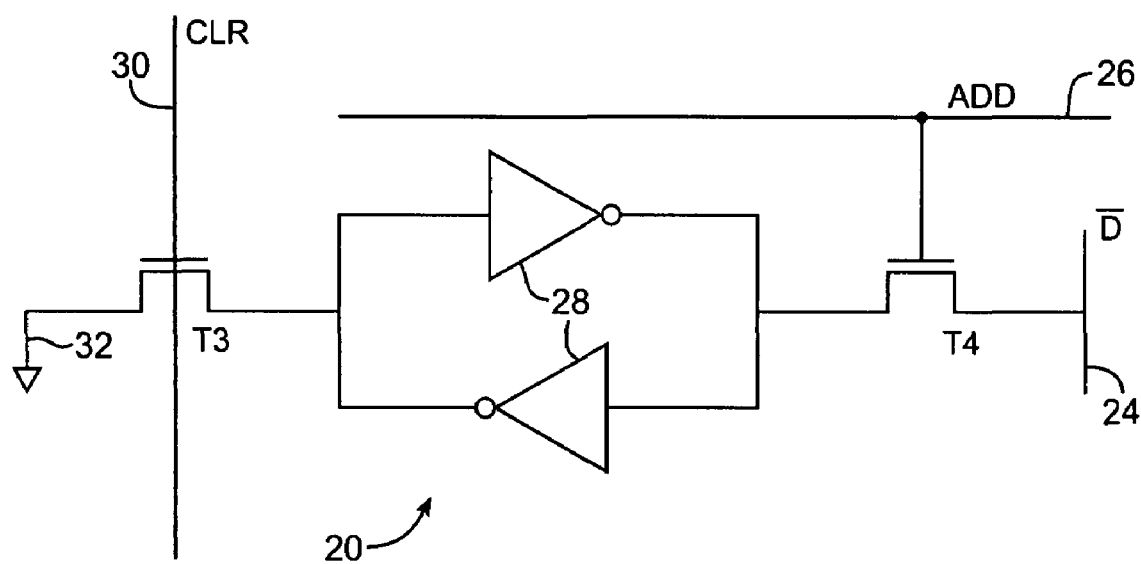
FIG. 4 is a diagram of an illustrative memory array architecture using an address line, a complement of a data line, and a clear line to load memory elements in accordance with the present invention.

Another illustrative memory element architecture that may be used in shown in FIG. 4. In the arrangement of FIG. 4, memory element 20 is loaded via transistors T3 and T4 using data lines 24, address line 26, and CLR line 30. During a typical loading operation, the clear line CLR is asserted to clear the memory array. Asserting the clear line turns on the transistor T3 that is associated with each memory element and connects that memory element to ground 32 to clear the cell contents. The clear line is then deasserted. The data to be loaded is placed on the data line 24 (e.g., on the data lines 24 in the columns of the entire memory array). The memory elements in the desired row of the memory array are then addressed by asserting the appropriate address line. In the example of FIG. 4, the memory element 20 is addressed by taking the line ADD high. This turns on transistor T4 and loads the data from line 24 into the memory element 20. After the data has been loaded, the address line is deasserted.

Figure 5:
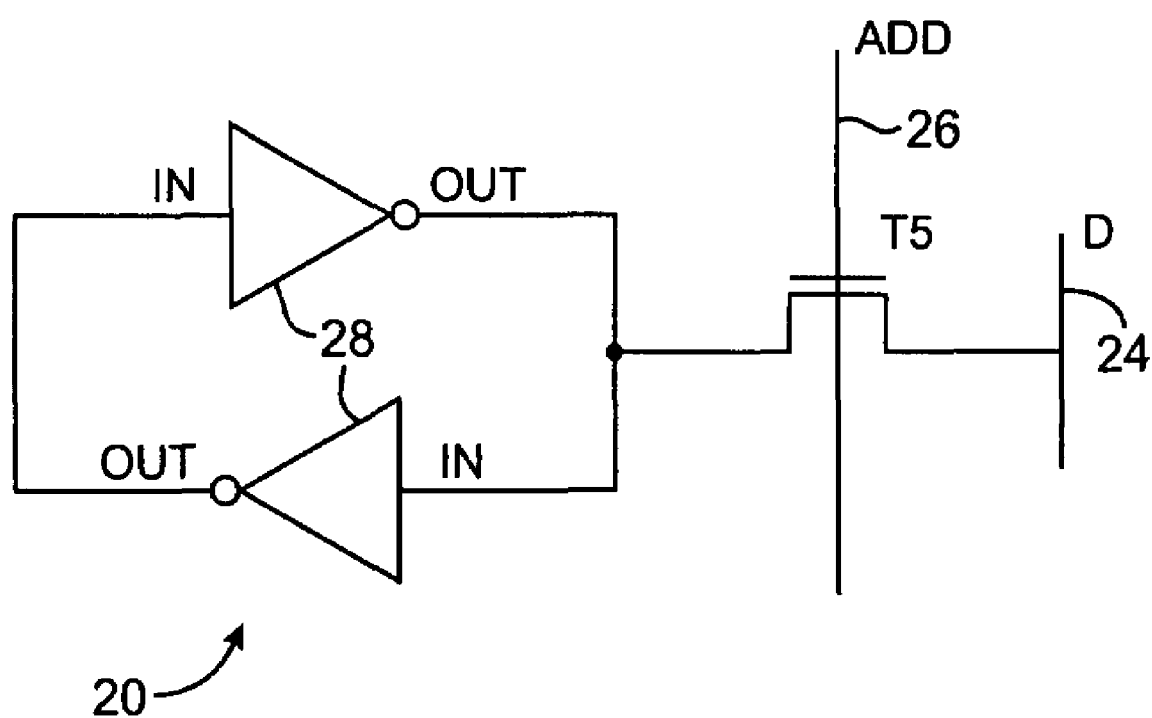
FIG. 5 is a diagram of an illustrative memory array architecture using a data line and an address line to load memory elements in accordance with the present invention.

Another illustrative memory element architecture that may be used in shown in FIG. 5. In the arrangement of FIG. 5, memory element 20 is loaded via transistor T5 using data line 24 and address line 26. During a typical loading operation, the memory element 20 is addressed by taking the line ADD high. This turns on transistor T5 and loads the data from line 24 into the memory element 20. After loading, the address line is deasserted (taken low in this example).

The architectures of FIGS. 3-5 are merely illustrative. In general, any suitable volatile memory element circuit and data addressing and loading circuitry may be used for the memory elements 20 if desired.

Figure 6:
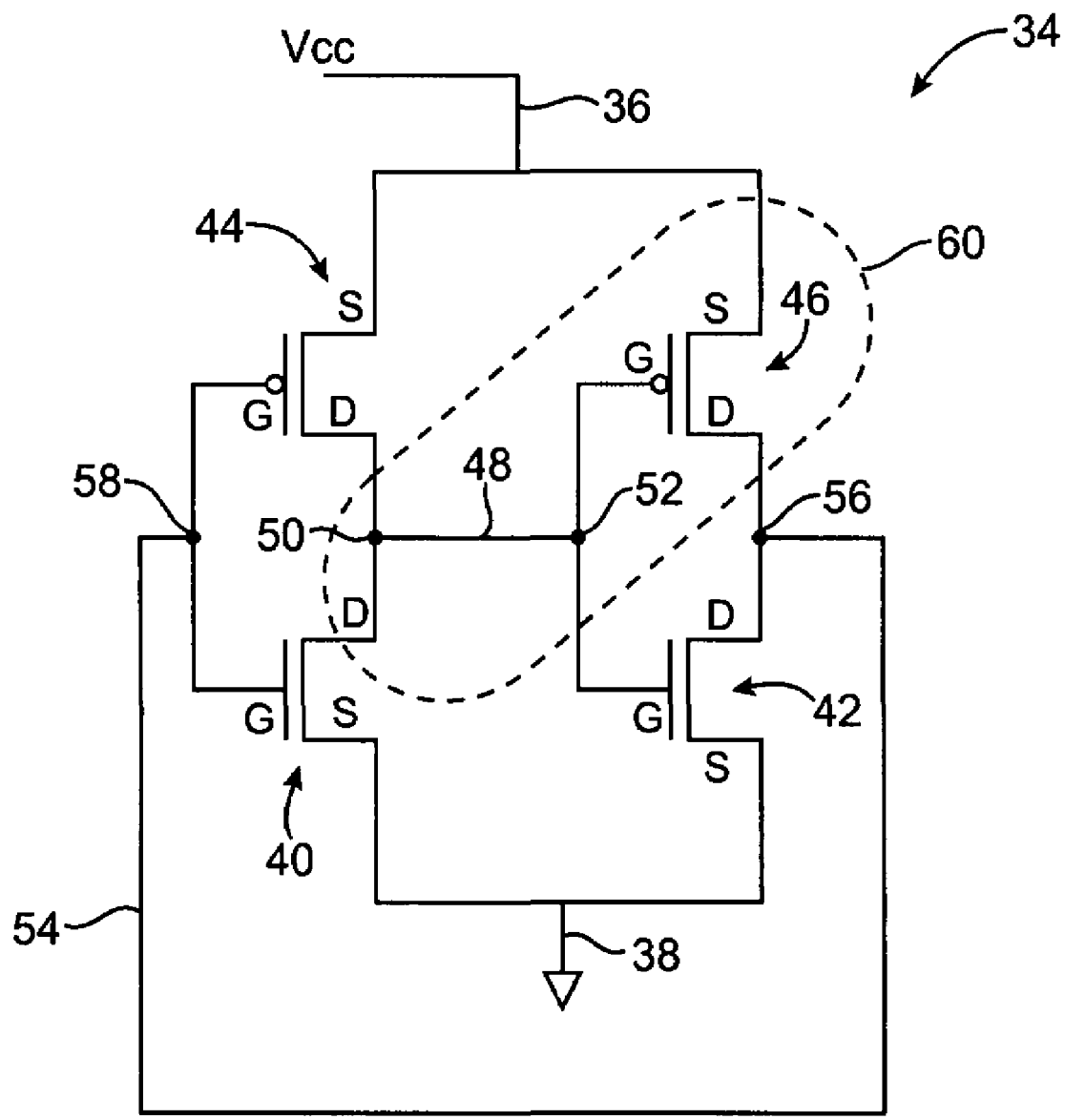
FIG. 6 is a diagram of an conventional memory element formed from cross-coupled inverters.

A conventional volatile memory element 34 used in programmable logic device integrated circuits is shown in FIG. 6. Power for the memory element 34 is supplied at positive power supply line 36 and ground terminal 38. Memory elements of the type shown in FIG. 6 are formed from two cross-coupled complementary metal-oxide-semiconductor (CMOS) inverters. One of the two inverters is made up of p-channel metal-oxide-semiconductor (PMOS) transistor 44 and n-channel metal-oxide semiconductor (NMOS) transistor 40. The other inverter is made up of PMOS transistor 46 and NMOS transistor 42. The inverters of element 34 are said to be cross-coupled, because the output 50 of the left-hand inverter is connected by line 48 to the input 52 of the right-hand inverter and the output 56 of the right-hand inverter is connected by line 54 to the input 58 of the left-hand inverter.

Figure 7:
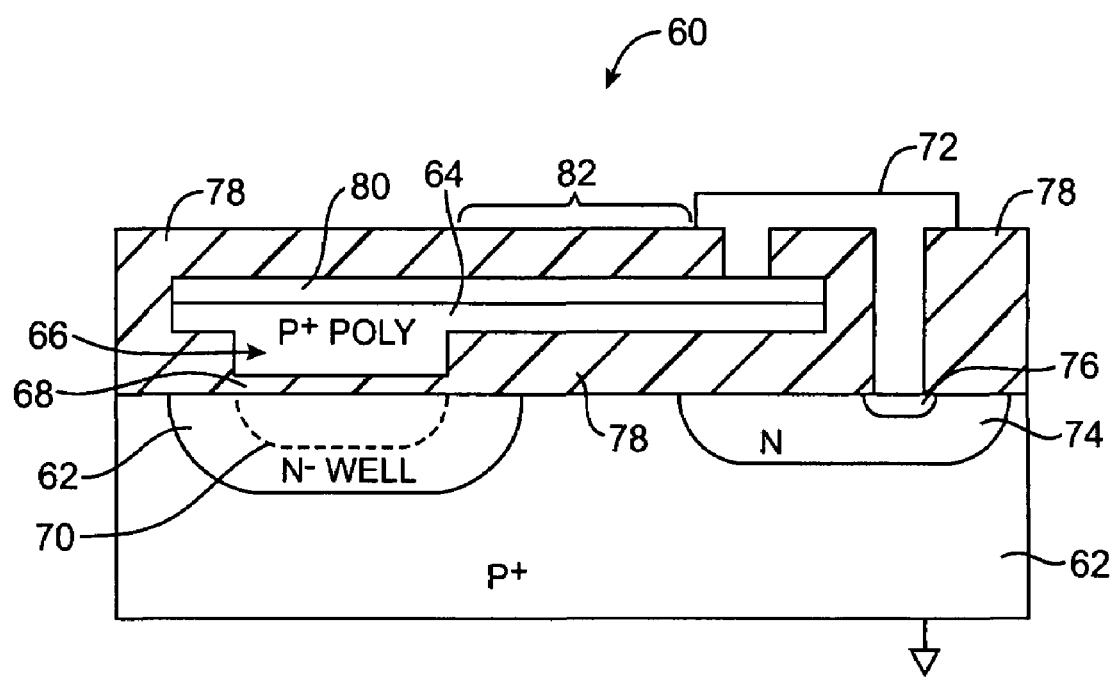
FIG. 7 is a cross-sectional diagram of a portion of the conventional memory element of FIG. 6 prior to an atomic particle strike.
Figure 8:
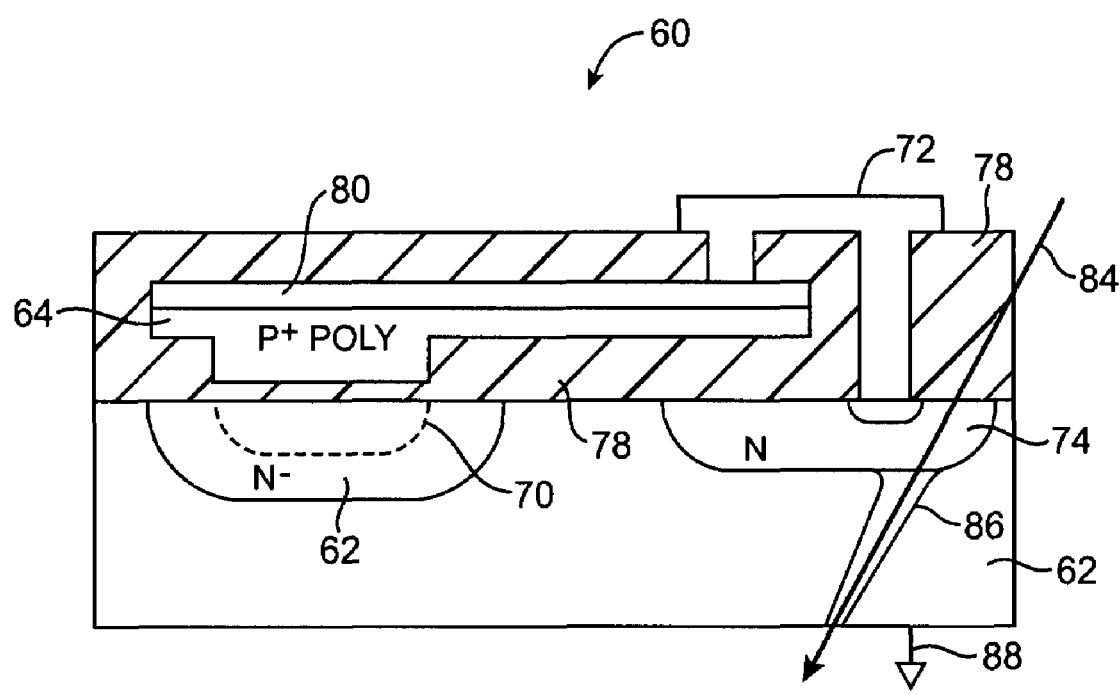
FIG. 8 is a cross-sectional diagram of the portion of the conventional memory element of FIG. 6 that is shown in FIG. 7 following an atomic particle strike.

The portion of the conventional memory element 34 that is encircled by dotted line 60 is shown in the cross-sectional view of FIGS. 7 and 8. FIGS. 7 and 8 illustrate the effect of an atomic particle strike on a conventional memory element. FIG. 7 shows the memory element before a particle has struck. FIG. 8 shows the memory element after a particle strike.

The elements shown in the cross-sections of FIGS. 7 and 8 include a silicon substrate (well) 62 with p+ doping. The source and drain of p-channel transistor 46 (FIG. 6) are formed in n-well 62 (lightly doped, as represented by the N− label in FIG. 7). P+ polysilicon 64 is used to form the gate 66 for this transistor. Gate oxide 68 ($SiO_2$) lies under gate 66. (In FIG. 6, the gate of transistor 46 is labeled "G".) Oxide 78 provides electrical isolation.

In the cross-sectional view of FIG. 7, the long dimension of the gate (its width) runs from left to right in the page. The short dimension of the gate (its length) runs perpendicular to the page. The dotted line 70 shows where the p-type channel is formed between the p-type source and p-type drain of the transistor. The source and drain implants lie farther into the page and farther out of the page than the p-type channel 70 and therefore do not appear in the cross-section of FIG. 7. Because the source and drain regions of metal-oxide-semiconductor transistors are formed of the same doping type, these regions are sometimes referred to as "source-drain" regions.

Contact metal 72 is used to electrically connect the gate 66 to the n-type region 74. N+ region 76 is provided so that metal 72 makes and ohmic contact with n-type region 74. Silicide layer 80 is provided to lower the sheet resistance of polysilicon 64. In a typical silicide formation process, a thin layer of titanium is deposited on polysilicon 64 and heat is applied, thereby forming titanium silicide. When a self-aligned process is used, a silicide such as silicide 80 is sometimes referred to as a self-aligned silicide (salicide). When polysilicon is coated with silicide it is sometimes referred to as silicided polysilicon.

The n-implant 74 of FIG. 7 forms the drain (labeled "D") of transistor 40 in FIG. 6. The drain region 74 (and the drain of transistor 44 of FIG. 6) are electrically connected to the gate 66 by the conductive pathway formed from metal 72 and portion 82 of silicided polysilicon 64.

FIG. 8 shows the effect of a high-energy atomic particle passing through the drain 74. The path of the particle in FIG. 8 is illustrated by line 84. The impact of the particle forms electron-hole pairs in P+ region 62. These carriers create a temporary conductive path 86 between region 74 and ground 88. As a result, any positive charge on gate 66 will be discharged through region 74. The path 86 lasts about 1 ns, before the electrons and holes recombine.

Consider, as an example, the situation in which memory element 34 of FIG. 6 has been loaded with a data bit that makes node 52 high (e.g., a logical "1"). During the particle strike, node 52 is discharged to ground through path 86 of FIG. 7. With the voltage of node 52 at ground, the state of memory element 34 is unstable and can spontaneously flip so that node 52 remains low (e.g., a logical "0"). The memory element 34 may remain in this flipped state even after the carriers produced by the particle strike have dissipated. This type of soft error event corrupts the data in the memory array and can render both the integrated circuit in which the error occurs and the system in which the circuit is used inoperable.

As the example of FIG. 8 demonstrates, soft error events occur when a high-energy atomic particle strikes a source-drain region that is connected to a gate whose voltage affects the state of the memory element. In the example of FIG. 8, the voltages on the gates of the memory element's inverters affect the state of the memory element. Accordingly, if a particle strikes a source-drain region in a transistor that is connected to one of these gates, the memory element's data may be corrupted. The transistors whose source-drain regions are connected to one of these gates are referred to as "controlling" transistors. Transistors such as transistors T1 and T2 in an architecture of the type shown in FIG. 3, transistors such as transistors T3 and T4 in an architecture of the type shown in FIG. 4, and transistor T5 in an architecture of the type shown in FIG. 5 have one of their source-drain regions connected to an inverter gate, so these transistors are considered controlling transistors. The transistors in the inverters themselves are also controlling transistors. As shown in FIG. 6, the drain of transistor 42 is connected to the gates of transistors 44 and 40, so a particle strike in the drain of transistor 42 can cause a soft error upset. Similarly, particle strikes in the drains of transistors 44, 46, and 40 can cause the memory element 34 of FIG. 6 to change state.

In accordance with the present invention, the gates of the transistors in the memory elements 20 are protected using nonlinear high-impedance two-terminal elements such as diodes. The high impedance of these elements makes the protected transistors immune to soft error upset events. By using diodes and other nonlinear elements, a high resistance is provided while consuming minimal real estate on the integrated circuit. The nonlinear elements of the present invention are compatible with standard fabrication processes and may generally be formed without adding additional mask levels to the conventional process flow.

There is a time period $T_{SWITCH}$ associated with switching the transistors in the inverters. This time period controls the speed at which the memory cell changes states. There is also a time period $T_{LIFETIME}$ associated with the conductive path 86 formed by a particle strike. The magnitudes of these time periods affect how a given memory element responds to the particle strike. If the value of $T_{SWITCH}$ is less than $T_{LIFETIME}$, the element is able to change states while the path 86 is still in existence. Memory elements with $T_{SWITCH}$ less than $T_{LIFETIME}$ are therefore subject to soft error upset events as described in connection with FIGS. 8 and 9. If, however, $T_{SWITCH}$ is greater than $T_{LIFETIME}$, the discharge path 86 will dissipate faster than the memory element can react. In this case, the memory element will be immune to soft error upset events.

Conventional approaches for providing soft error immunity have focused on providing configuration memory cells with larger effective values of cell capacitance (C) or have focused on reducing cell dimensions to reduce the cross-sectional area exposed to particle strikes. Some conventional static RAM designs have placed resistors in the gate path to increase the RC product without adjusting C.

In accordance with the present invention, nonlinear high-impedance two-terminal elements are placed in the gate paths of the inverter transistors. The impedances of the nonlinear elements are preferably large enough to ensure that the product RC associated with these paths and therefore the memory element switching time $T_{SWITCH}$ is greater than the expected lifetime $T_{LIFETIME}$ of the conductive discharge paths such as path 86 of FIG. 8 that are produced by high-energy atomic particle strikes. This makes the memory elements immune to soft error upset events, because the memory elements are unable to switch fast enough to flip their states when a node is discharged due to a strike. The regenerative nature of the memory element circuit restores the voltage on the discharged node as soon as the discharge path dissipates. Unlike conventional SRAM arrangements that use added resistors, the arrangement of the present invention provides high impedances without consuming large amounts of circuit real estate and may be formed with processes that are compatible with existing fabrication steps. With one suitable approach, no additional mask layers are required during semiconductor fabrication.

Figure 9:
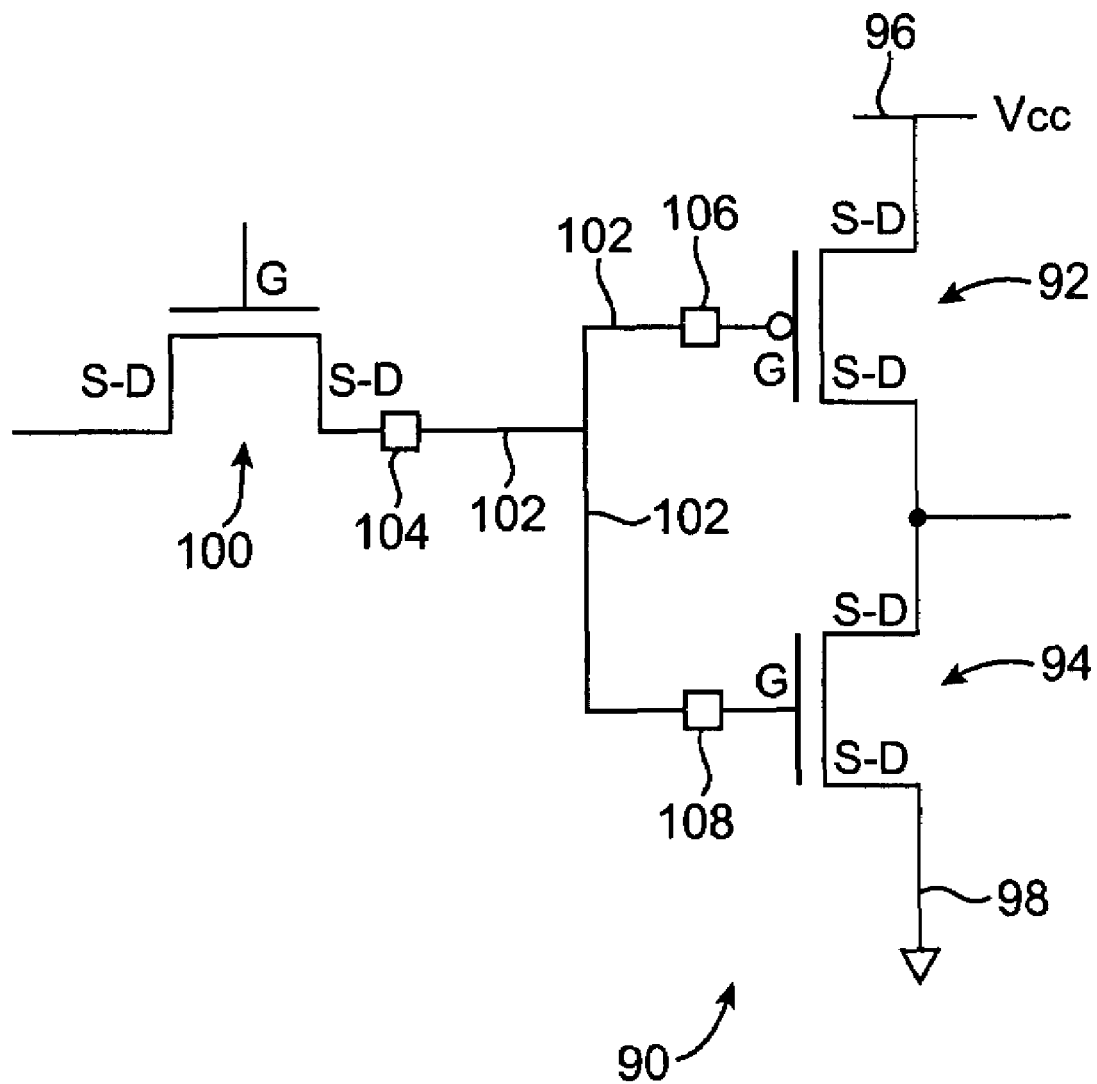
FIG. 9 is a diagram of a portion of an illustrative memory element having nonlinear high-impedance two-terminal elements in accordance with the present invention.

FIG. 9 shows illustrative locations for the nonlinear high-impedance two-terminal elements within a memory element in accordance with the present invention. Inverter 90 is one of two cross-coupled inverters that make up a memory element. In the example of FIG. 9, inverter 90 has two transistors—PMOS transistor 92 and NMOS transistor 94 powered using a positive power supply terminal 96 and ground 98. Controlling transistor 100 may be located in an inverter that is cross coupled with inverter 90 or may be one of the transistors such as transistors T1, T2, T3, T4, and T5 described in connection with FIGS. 3-5. In general, each memory element 20 contains multiple controlling transistors such as transistor 100. Particle strikes in the source-drain region of any of these transistors could lead to a soft error upset if inverter 90 is not properly protected.

Transistors 92, 94, and 100 have gates labeled "G" and source-drain regions labeled "S-D". If a high-energy atomic particle strikes the source-drain region of transistor 100, a path such as path 86 of FIG. 8 will be created for a time $T_{LIFETIME}$. To prevent the transistors 92 and 94 from switching more rapidly than $T_{LIFETIME}$, one or more nonlinear high-impedance two-terminal elements such as elements 104, 106, and 108 are included in the memory element in the path 102 connecting the source-drain of controlling transistor 100 and the gates of transistors 92 and 94. The path 102 typically includes metal, doped polysilicon, and silicided polysilicon. Unlike resistive elements such as polysilicon resistors, the impedance of the nonlinear high-impedance two-terminal element is not linear as a function of applied voltage. Nevertheless, the impedance of the nonlinear high-impedance two-terminal element is large enough over its operating range to ensure that $T_{SWITCH}$ is greater than $T_{LIFETIME}$. This makes the memory element immune to soft error upset events.

As shown in FIG. 9, the nonlinear high-impedance two-terminal elements may be placed adjacent to the source-drain of transistor 100 as with element 104, may be placed adjacent to the gate of PMOS transistor 92 as with element 106, or may be placed adjacent to the gate of NMOS transistor 94 as with element 108. In general, the nonlinear high-impedance two-terminal elements in each inverter in the memory element may be placed in all of these positions, in some of these positions, or in one of these positions. If desired, each inverter may have a different number of nonlinear elements. For example, one inverter may have two nonlinear elements and the other inverter may have no nonlinear elements.

An advantage of using a nonlinear high-impedance two-terminal element in the location of element 104 is that high-impedance elements in this location simultaneously protect both transistor 92 and transistor 94. An advantage of using an element in the position of element 106 and/or 108 is that these positions may provide layout flexibility that is not available when using the position of element 104.

Figure 10:
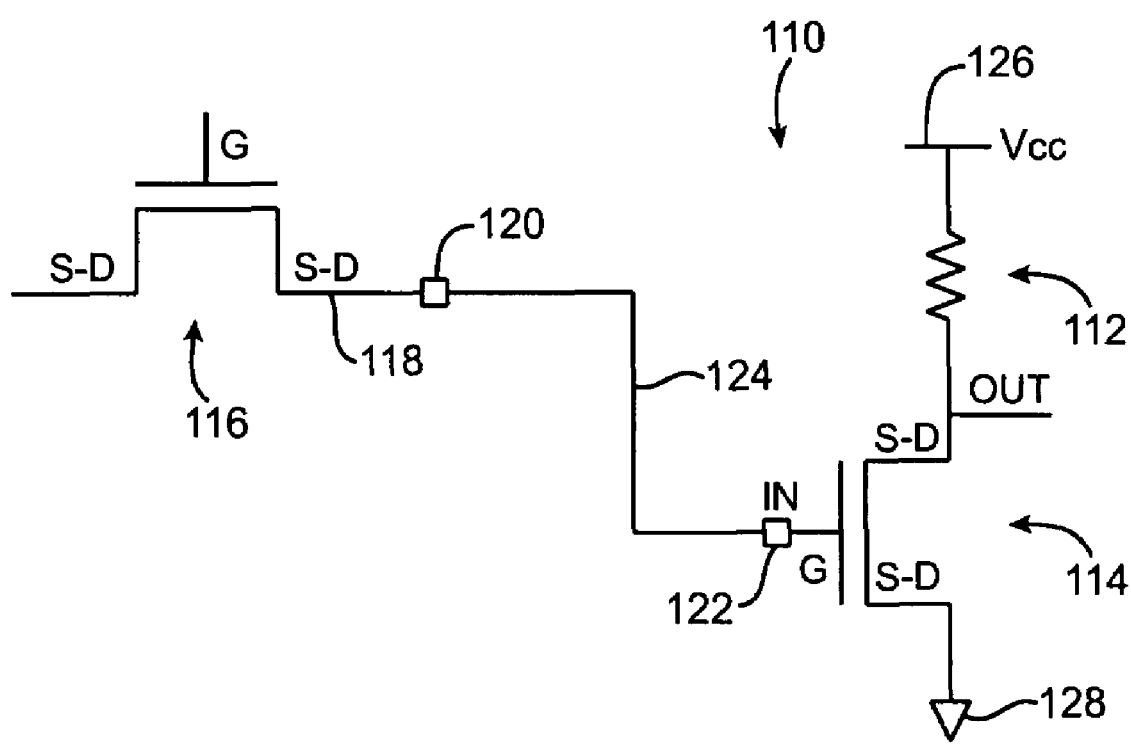
FIG. 10 is a diagram of a portion of another illustrative memory element in accordance with the present invention.

If desired, one or both of the inverters in the memory element may use a resistive load. An illustrative inverter 110 with a resistive load is shown in FIG. 10. Inverter 110 has a resistor 112 that serves as a load and a transistor 114. Power is applied to inverter 110 using positive power supply voltage line 126 and ground line 128. Controlling transistor 116 has a source-drain region 118 that may be struck by a high-energy atomic particle. There are generally multiple controlling transistors (e.g., two transistors in the cross-coupled inverter and a data loading transistor), but a single controlling transistor 116 is shown in FIG. 10 to avoid over-complicating the drawing. Because the source-drain regions of the controlling transistors (e.g., transistor 116 in FIG. 10) can be struck by a high-energy atomic particle, nonlinear high-impedance two-terminal elements 120 and/or 122 are provided in the path 124 connected to the gate of transistor 114. In this illustrative arrangement, nonlinear element 120 is formed adjacent to source-drain 118 and nonlinear element 122 is formed adjacent to gate 114.

The examples of FIGS. 9 and 10 are merely illustrative. In general, nonlinear elements may be placed at any suitable locations in the gate paths of the memory element, so long as the resulting switching time for the memory element is sufficient to ensure that the state of the memory element does not switch when subjected to a particle-induced discharge event. For example, a nonlinear element may be formed at a location in a path such as path 124 that is midway between the path endpoints (e.g., at a location that is approximately equidistant from both source-drain 118 and the gate G of transistor 114).

Figure 11:
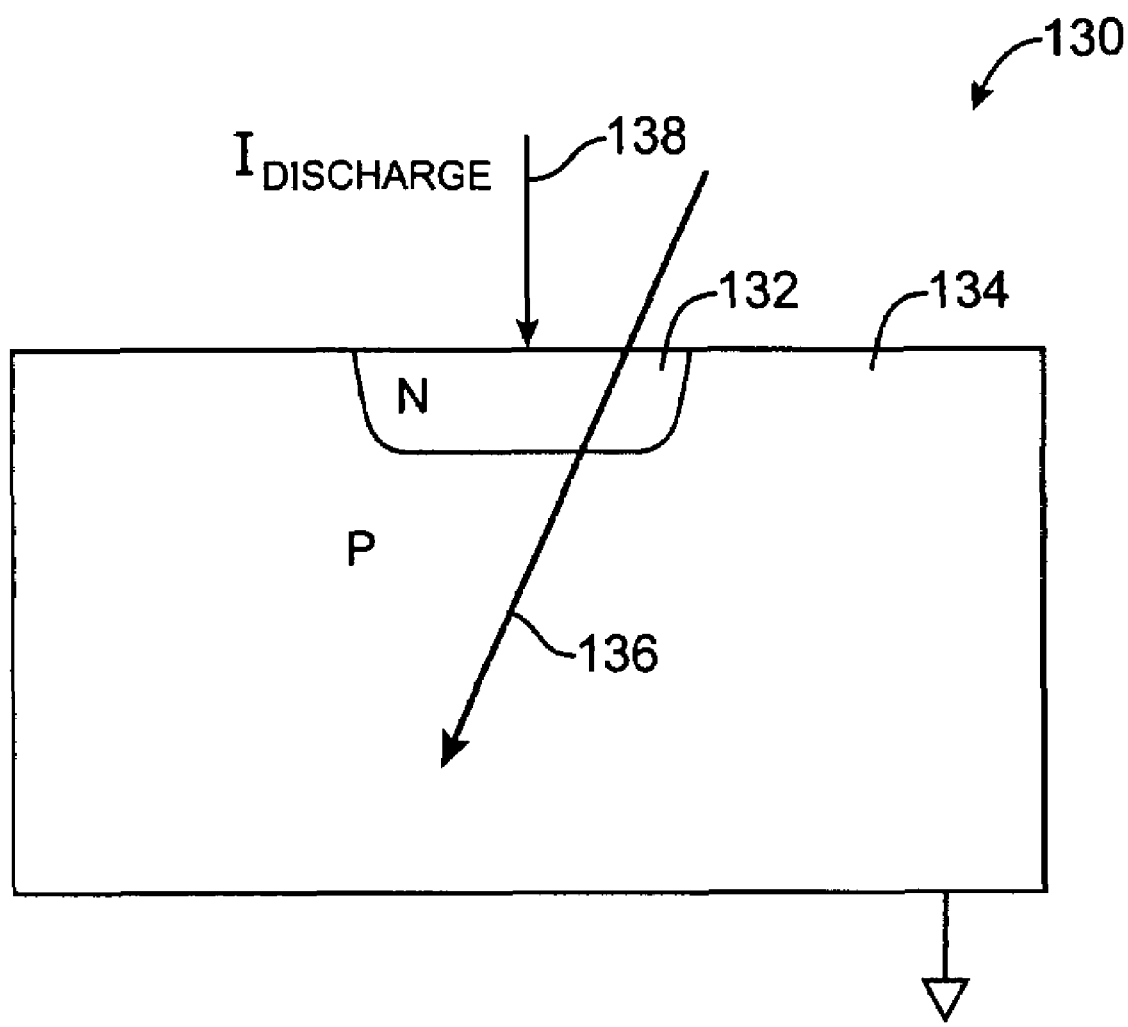
FIG. 11 is a cross-sectional diagram of an atomic particle strike in the source-drain region of an illustrative transistor showing the polarity of the expected discharge current.

During a particle strike, electron-hole pairs (carriers) are formed along the particle's path. This leads to a discharge current when nodes in the element are charged. A cross-sectional view of an illustrative transistor structure 130 in a memory element 20 is shown in FIG. 11. Structure 130 has a source-drain region 132. Source-drain regions such as region 132 are typically formed by ion implantation and are therefore sometimes referred to as implants or implant regions. In the example of FIG. 11, source-drain region 132 has n-type doping and is formed in a p-type region 134 (e.g., a p-type silicon substrate). When an atomic particle strikes source-drain region 132 along path 136, a discharge current $I_{DISCHARGE}$ may be produced, as described in connection with FIG. 8. The expected polarity for the discharge current $I_{DISCHARGE}$ is shown by line 138 in FIG. 11.

Figure 12:
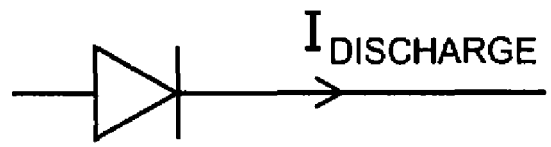
FIG. 12 is a diagram showing how the nonlinear high-impedance two-terminal elements of FIG. 9 may be formed from a diode that is forward biased during discharge in accordance with the present invention.
Figure 13:
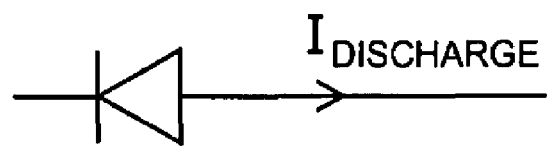
FIG. 13 is a diagram showing how the nonlinear high-impedance two-terminal elements of FIG. 9 may be formed from a diode that is reverse biased during discharge in accordance with the present invention.
Figure 16:
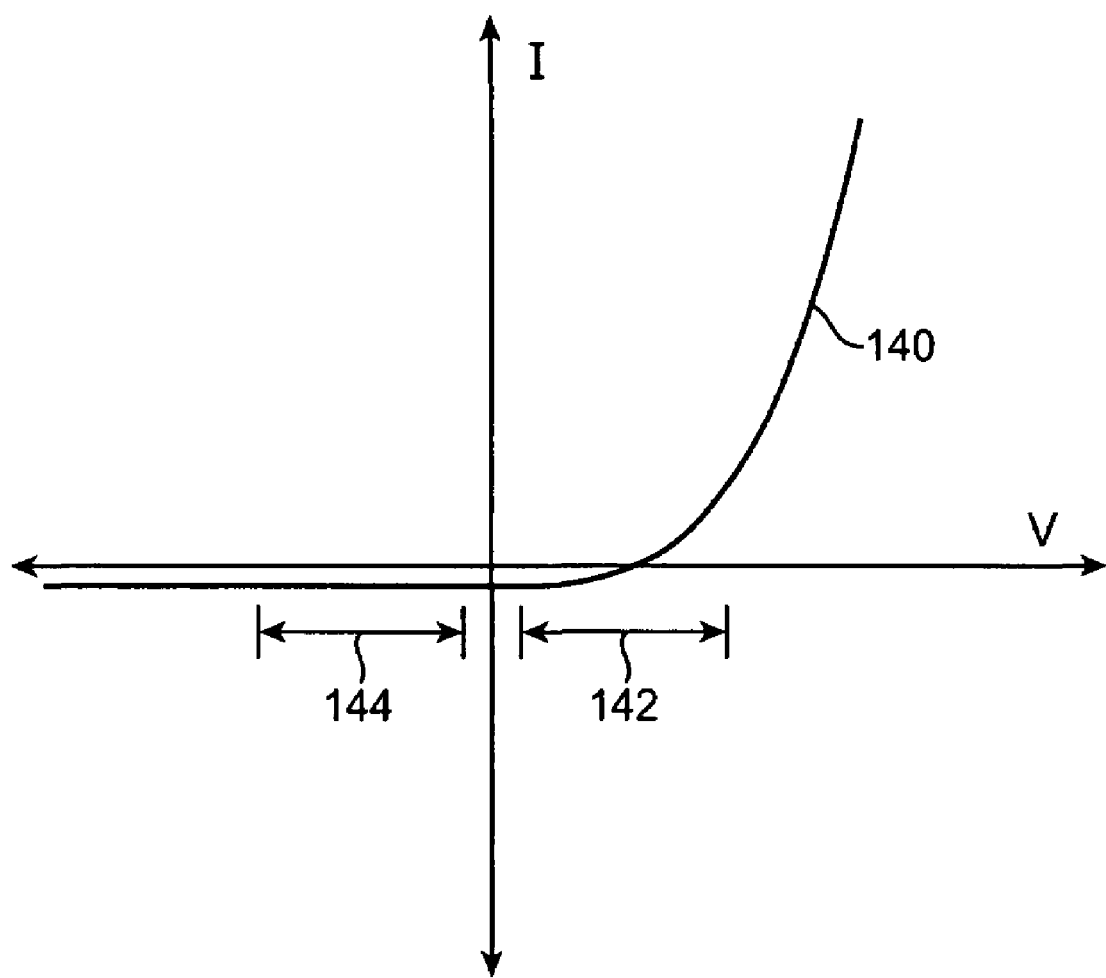
FIG. 16 is a graph of an illustrative current-voltage relationship for a nonlinear high-impedance two-terminal element formed from a diode in accordance with the present invention.

The nonlinear high-impedance two-terminal elements of the present invention may be formed from diodes or other nonlinear elements. An example of a nonlinear high-impedance two-terminal element formed from a diode is shown in FIGS. 12 and 13. Depending on the polarity of the discharge current $I_{DISCHARGE}$, the diode of the nonlinear high-impedance two-terminal element may be forward biased during discharge (FIG. 12) or may be reverse-biased during discharge (FIG. 13). FIG. 16 contains a graph of an illustrative current-voltage (I-V) curve 140 for a diode such as the diodes of FIGS. 12 and 13. If the diode is reverse biased during the discharge event, the diode is expected to operate in a range such as range 144 of FIG. 16. If the diode is forward biased during the discharge event, the diode is expected to operate in a range such as range 142. In range 144, the impedance of the diode (and therefore the nonlinear high-impedance two-terminal element) is always high. In range 142, the impedance of the diode (and therefore the nonlinear high-impedance two-terminal element) is generally high, although there may be some impedance reduction at the higher end of the voltage range (near the diode turn-on voltage $V_{ON}$ of about 0.7 volts). In many situations, the voltage across the nonlinear high-impedance two-terminal element will remain below 0.7 volts, so that the forward-biased and reverse biased diodes will have nearly equal high-impedance values.

Figure 14:
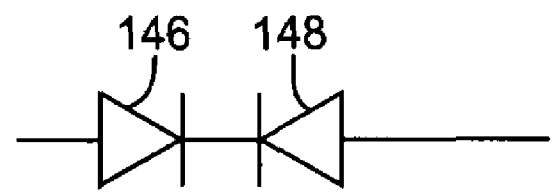
FIG. 14 is a diagram showing how the nonlinear high-impedance two-terminal elements of FIG. 9 may be formed from back-to-back diodes having a shared cathode in accordance with the present invention.
Figure 15:
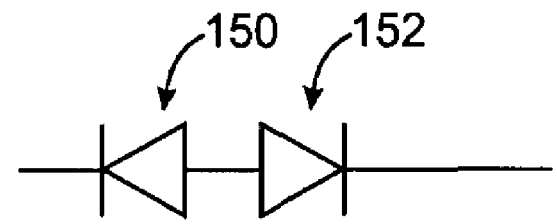
FIG. 15 is a diagram showing how the nonlinear high-impedance two-terminal elements of FIG. 9 may be formed from back-to-back diodes having a shared anode in accordance with the present invention.

To ensure that the impedance of the nonlinear high-impedance two-terminal element remains high, regardless of the operating voltage and discharge current polarity, a back-to-back diode arrangement may be used, as shown in FIGS. 14 and 15. In this type of arrangement, if one diode is momentarily turned on because its turn-on voltage has been exceeded, the other diode in the back-to-back arrangement will be reverse biased to ensure a high impedance. The nonlinear high-impedance two-terminal element of FIG. 14 is referred to as using a common cathode configuration, because the cathodes of the two diodes 146 and 148 are connected to each other. The nonlinear high-impedance two-terminal element of FIG. 15 is referred to as using a common anode configuration, because the anodes of diodes 150 and 152 are connected to each other.

The diode-based configurations of FIGS. 12, 13, 14, and 15 are merely illustrative. In general, the nonlinear high-impedance two-terminal element may be based on any suitable number of diodes arranged in any suitable polarity. For example, the nonlinear high-impedance two-terminal element may be based on two forward-biased diodes, two reverse-biased diodes, three forward-biased diodes, three reverse-biased diodes, two back-to-back diodes (either common cathode or common anode) in series with a forward-biased diode or a reverse biased diode, more than three diodes, etc.

Figure 17:
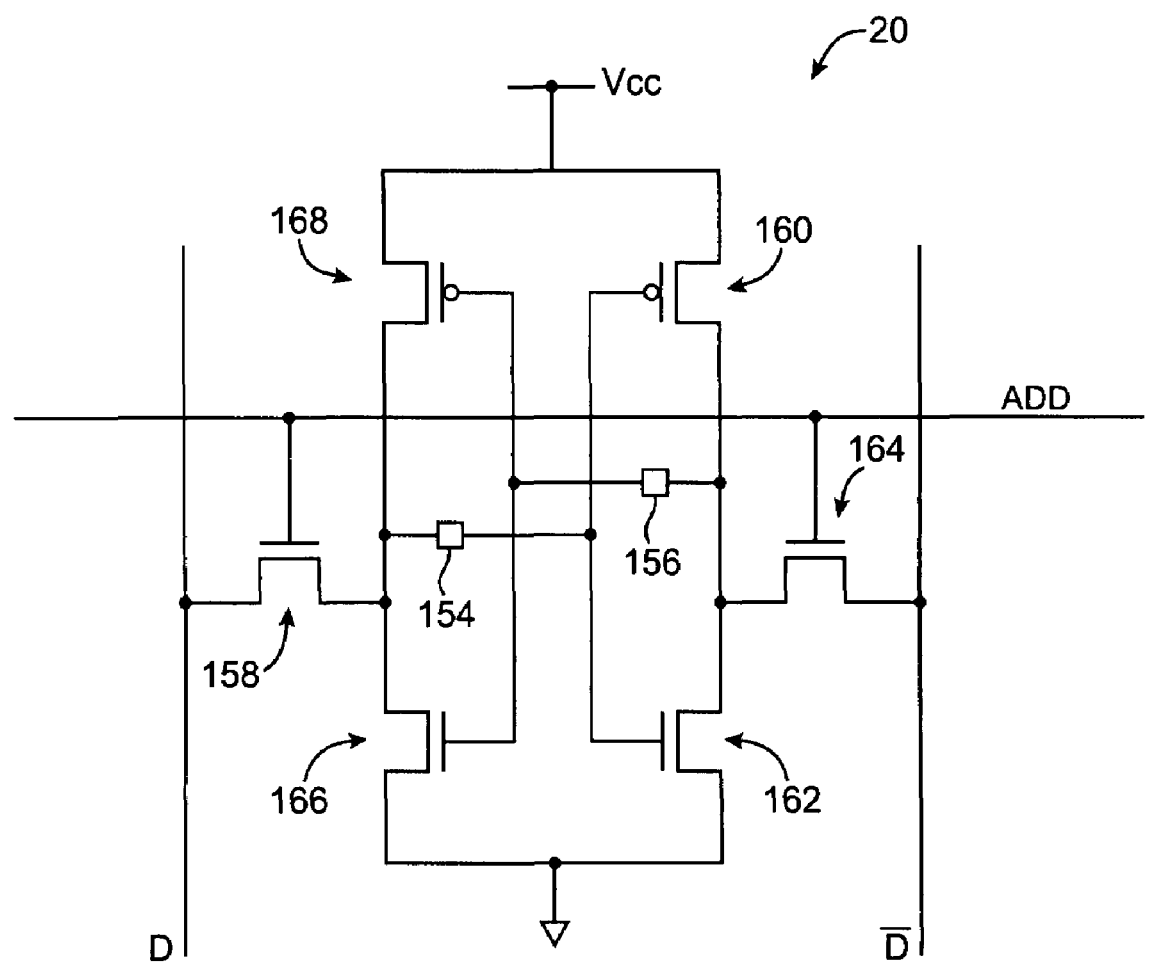
FIG. 17 is a diagram of an illustrative volatile memory element with nonlinear high-impedance two-terminal elements placed between the gates of its cross-coupled inverters and source-drain regions of transistors that control the gates in accordance with the present invention.

FIG. 17 shows an illustrative memory element 20 with two nonlinear high-impedance two-terminal elements 154 and 156. In the example of FIG. 17 (and the related examples of FIGS. 18-33, the illustrative memory element loading architecture of FIG. 3 is used. In general, any suitable architecture may be used such as the architecture of FIG. 4, the architecture of FIG. 5, etc. The use of the FIG. 3 architecture is merely illustrative.

An advantage of the arrangement of FIG. 17 is that is provides soft-error protection for both the left-hand and right-hand inverters while only requiring the use of two nonlinear high-impedance two-terminal elements. There are six "controlling" transistors in the example of FIG. 17—transistor 158, transistor 168, and transistor 166 have source-drain regions that are connected to the gates (input) of the right-hand inverter through element 154, whereas transistor 164, transistor 160, and transistor 162 have source-drains that are connected to the gates (input) of the left-hand inverter through element 156. Element 154, which may be formed adjacent to one or more of the source-drains of transistors 168, 158, and 166, provides a high-impedance path to the gates of both transistor 160 and 162. Similarly, element 156, which may be formed adjacent to one or more of the source-drains of transistors 164, 160, and 162, ensures that the paths to the gates of both transistor 166 and 168 have a high impedance. The arrangement of FIG. 17 therefore provides full coverage for the transistor gates of memory element 20 using only two nonlinear high-impedance two-terminal elements.

Figure 18:
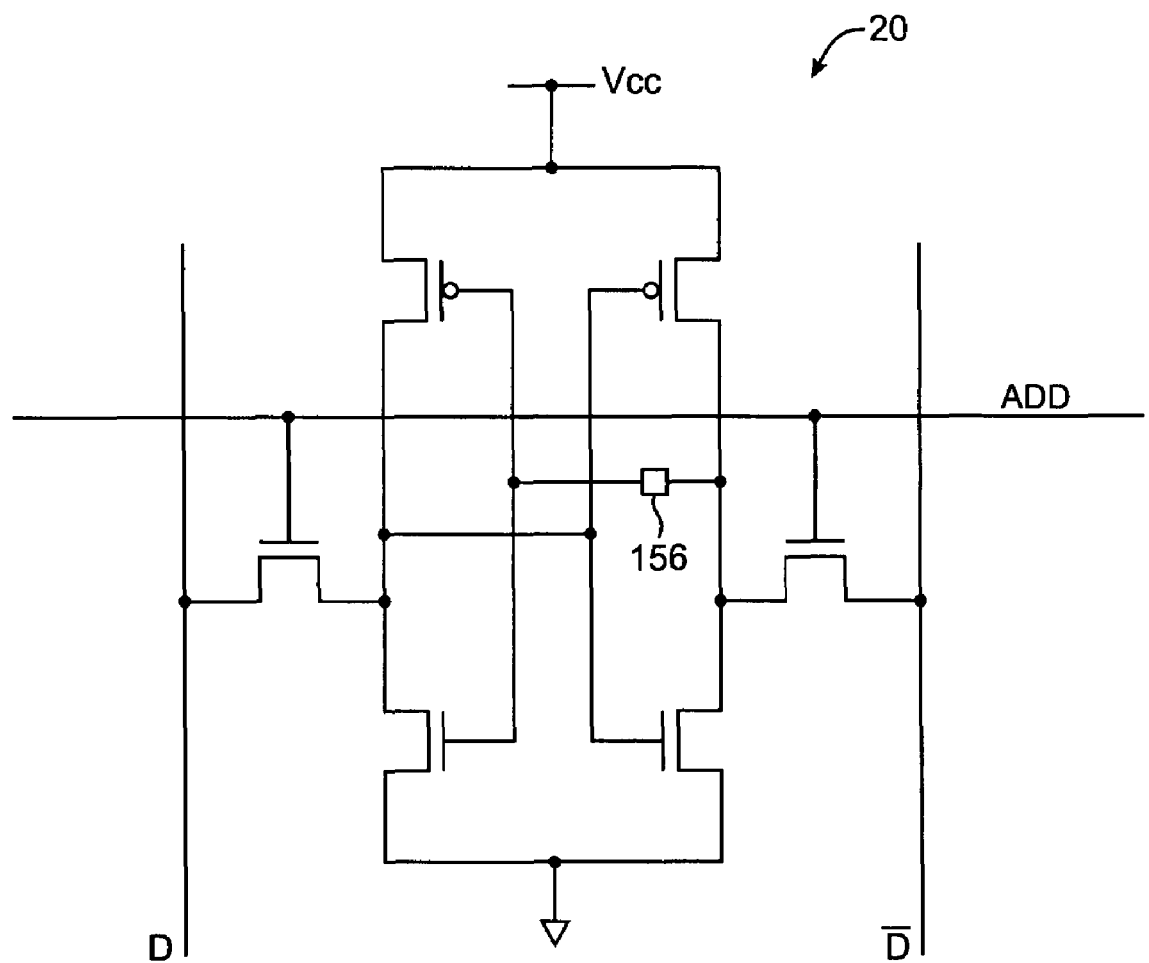
FIG. 18 is a diagram of an illustrative volatile memory element with a single nonlinear high-impedance two-terminal element placed between the gates of one of two cross-coupled inverters and source/drain regions of transistors that control the gates in accordance with the present invention.

Sometimes, circuit layout considerations or real estate considerations may favor a different arrangement of high-impedance elements. An example is shown in FIG. 18. In the example of FIG. 18, only a single nonlinear high-impedance two-terminal element 156 is used. The left-hand inverter is protected in the example of FIG. 18, but, if desired, an element 154 of the type shown in FIG. 17 can be used to protect the right-hand inverter while omitting element 156.

Single-element arrangements of the type shown in FIG. 18 offer improved coverage over a design with no nonlinear high-impedance two-terminal elements and may be more acceptable than a two-element arrangement given real estate constraints.

Figure 19:
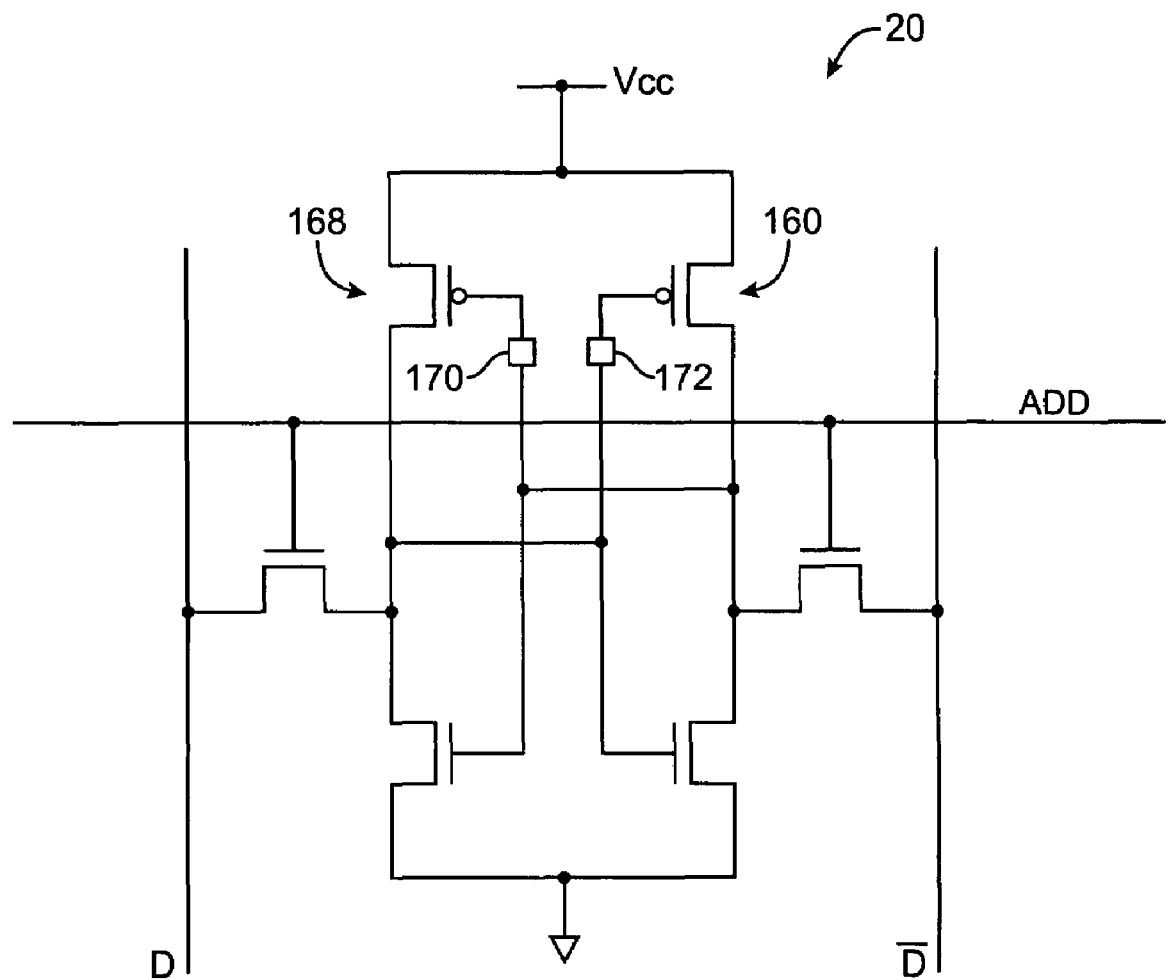
FIG. 19 is a diagram of an illustrative volatile memory element with nonlinear high-impedance two-terminal elements formed adjacent to the gates of the p-channel metal-oxide-semiconductor transistors in its cross-coupled inverters in accordance with the present invention.

In the illustrative arrangement of FIG. 19, nonlinear high-impedance two-terminal elements 170 and 172 are placed adjacent to the gates of transistors 168 and 160, respectively. This type of arrangement may be advantageous when optimizing the layout of the integrated circuit.

Figure 20:
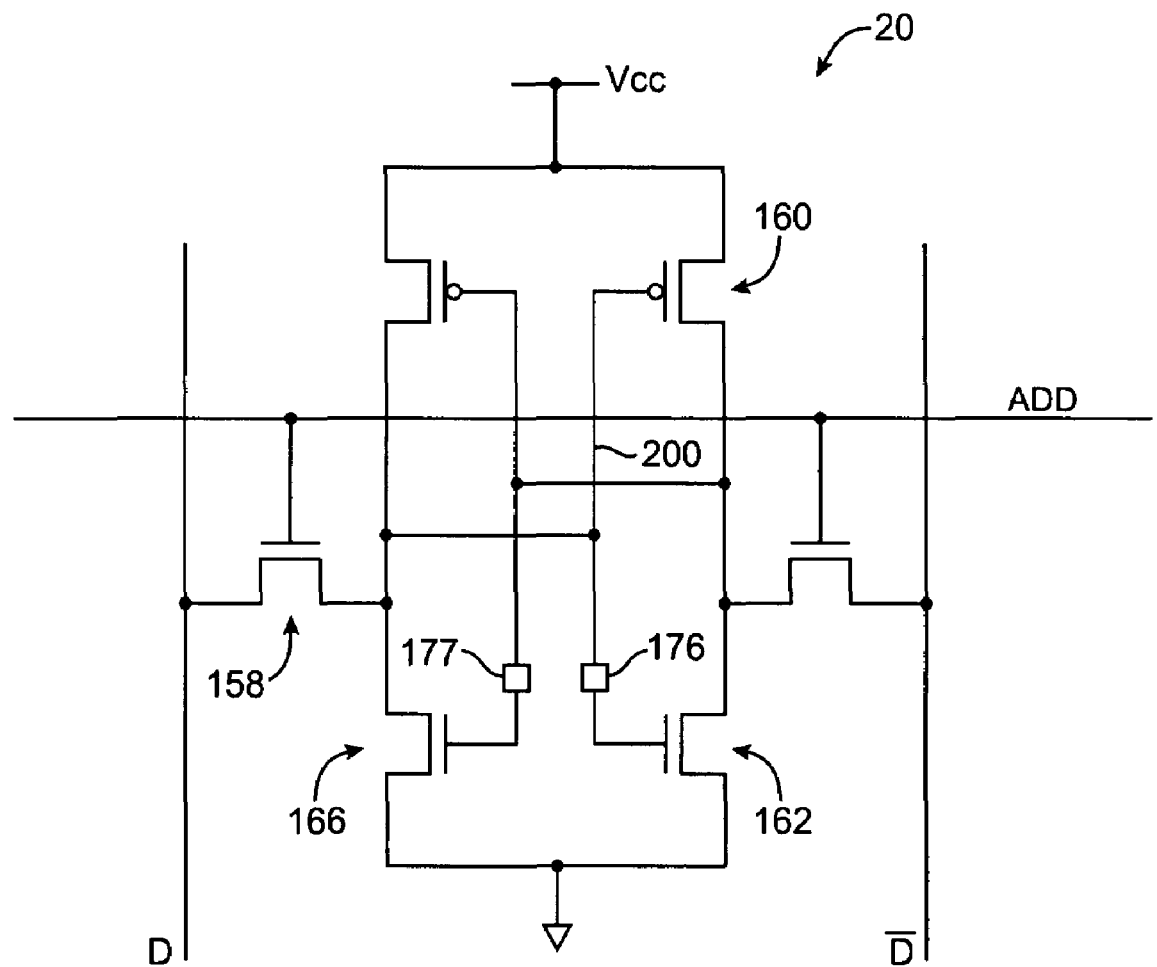
FIG. 20 is a diagram of an illustrative volatile memory element with nonlinear high-impedance two-terminal elements formed adjacent to the gates of the n-channel metal-oxide-semiconductor transistors in its cross-coupled inverters in accordance with the present invention.

FIG. 20 shows an example of a memory element 20 in which the nonlinear high-impedance two-terminal elements 174 and 162 are placed adjacent to the gates of transistors 166 and 176, respectively. As with the arrangement of FIG. 19, this type of arrangement may be advantageous when optimizing the layout of the integrated circuit.

Figure 21:
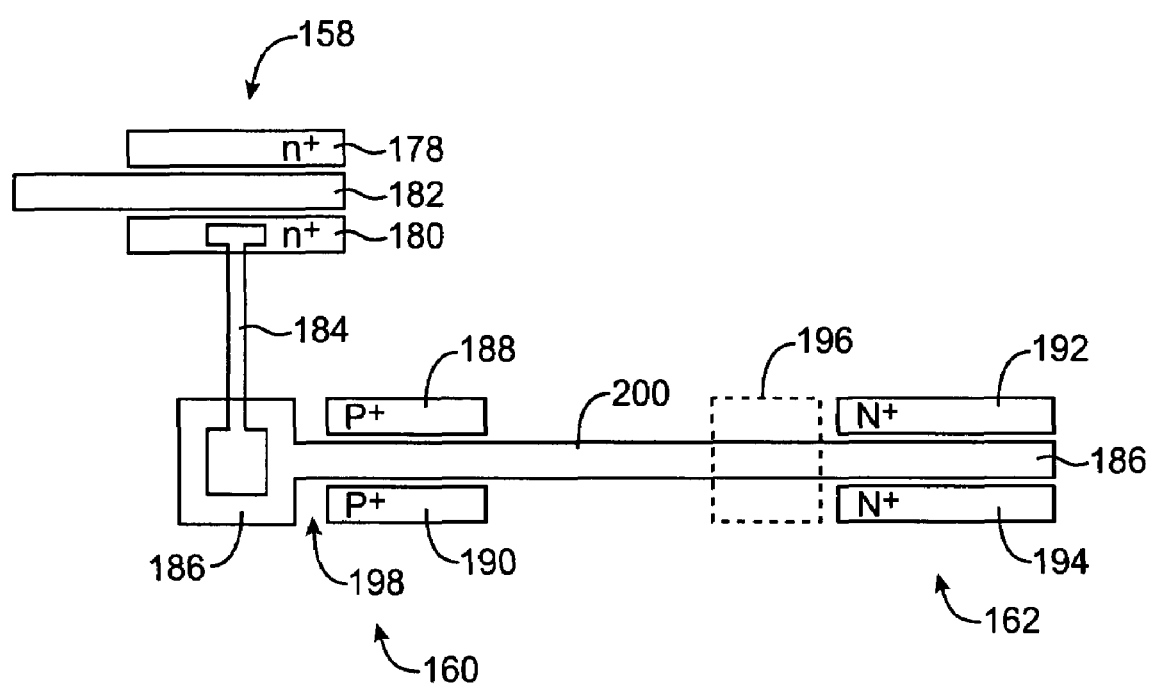
FIG. 21 is a top view of a portion of the volatile memory element of FIG. 20 showing how layout considerations may influence where the nonlinear high-impedance two-terminal elements are formed in accordance with the present invention.

A top-view of some of the structures in the FIG. 20 memory element is shown in FIG. 21. In this example, regions 178 and 180 are the source-drain regions of a controlling transistor such as transistor 158 of FIG. 20. Gate 182 is the gate of transistor 158. Metal line 184 connects the source-drain 180 of controlling transistor 158 to the gate conductor 186. Due to layout considerations, a conductor 186 is used that serves as the gate of PMOS transistor 160 (FIG. 20), the gate of NMOS transistor 162 (FIG. 20), and the conductor 200 (FIG. 20) that electrically connects the gate of transistor 160 to the gate of transistor 162. P+ regions 188 and 190 form the source-drain regions of PMOS transistor 160 and N+ regions 192 and 194 form the source-drain regions of NMOS transistor 162.

Conductor 186 is formed from polysilicon. Because the P+ regions 188 and 190 are formed close to the end of conductor 186 in this example, there is insufficient real estate in area 198 to form a nonlinear high-impedance two-terminal element from the polysilicon of conductor 186. Accordingly, it is preferable to form the nonlinear high-impedance two-terminal element 176 from the polysilicon 186 in the region 196 (i.e., adjacent to the gate of transistor 162 as shown in FIG. 20).

Figure 22:
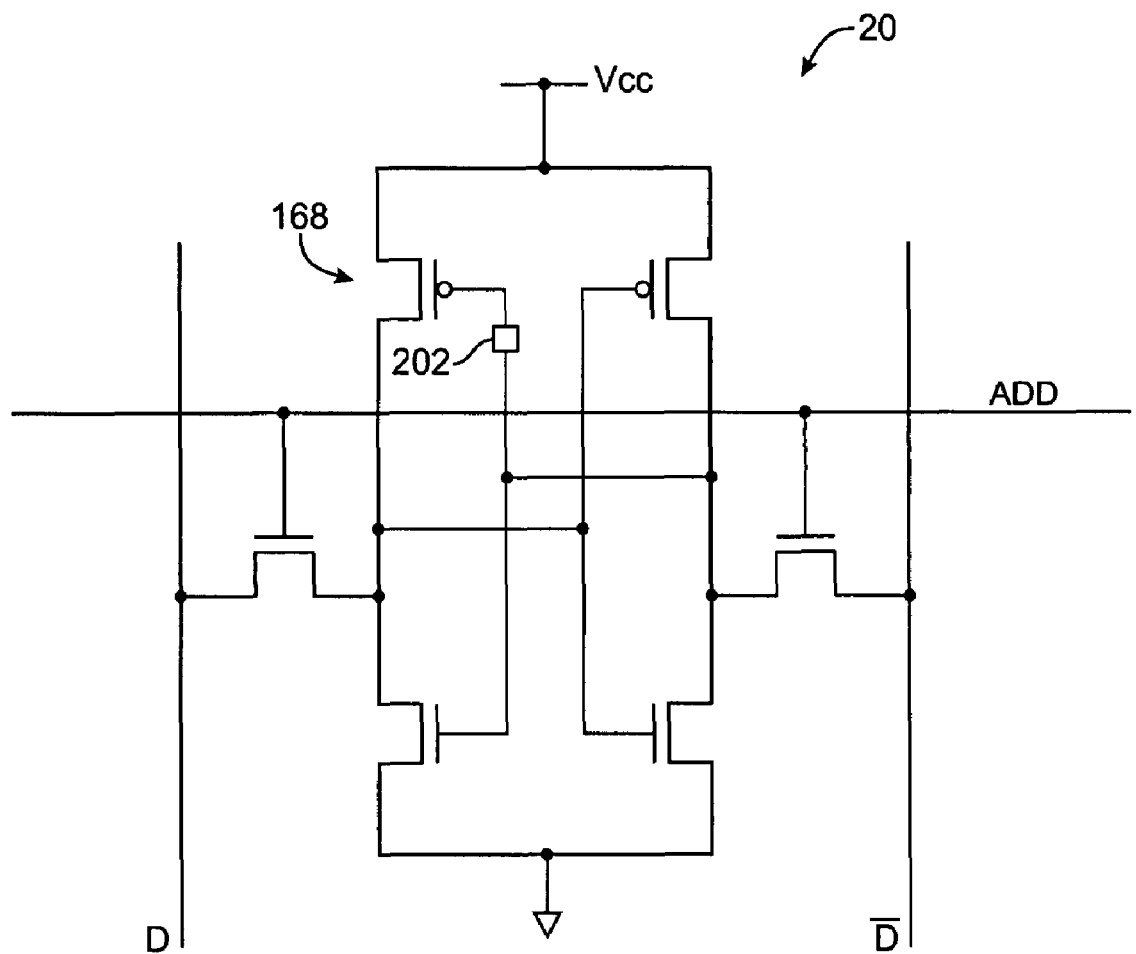
FIG. 22 is a diagram of an illustrative volatile memory element with a single nonlinear high-impedance two-terminal element formed adjacent to the gate of one of the p-channel metal-oxide-semiconductor transistors in its cross-coupled inverters in accordance with the present invention.
Figure 23:
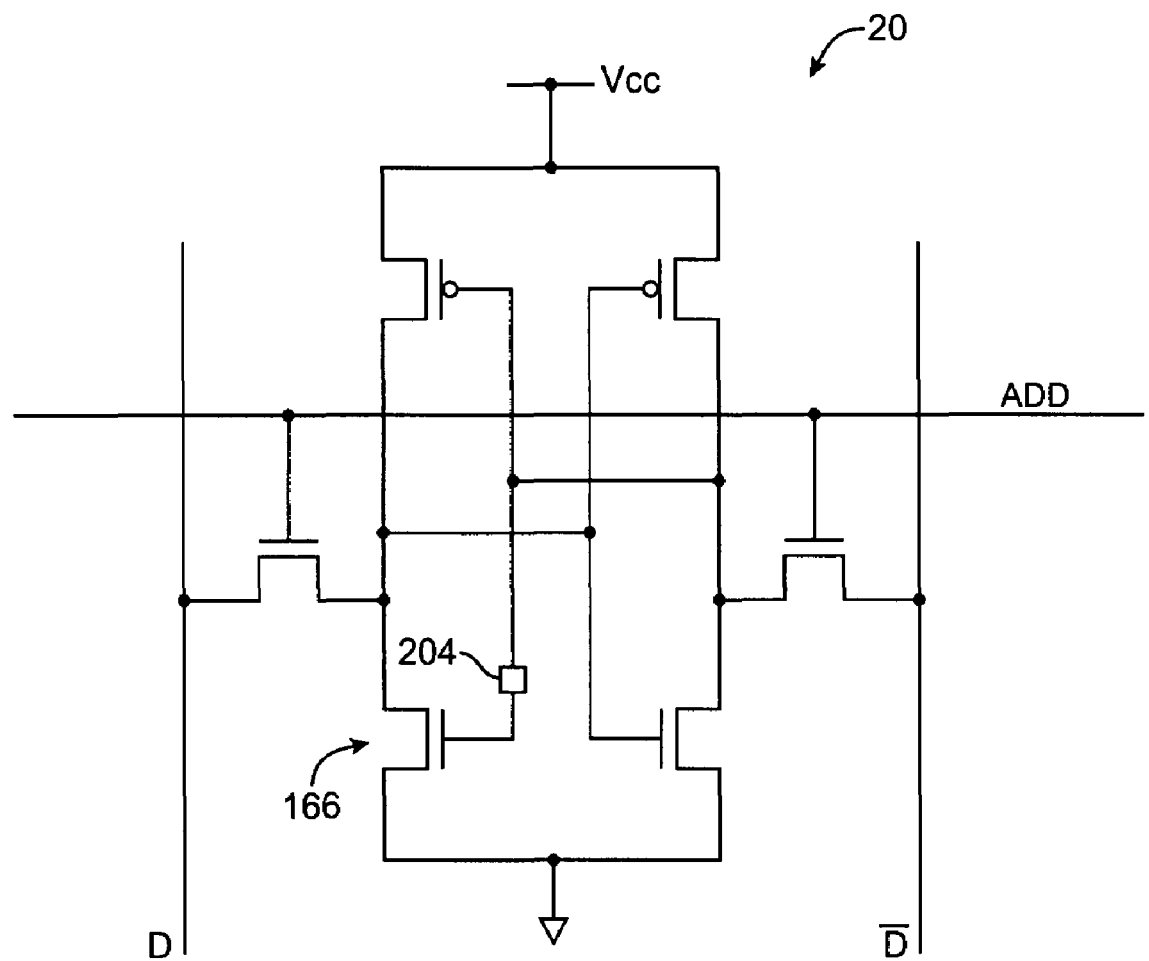
FIG. 23 is a diagram of an illustrative volatile memory element with a single nonlinear high-impedance two-terminal element formed adjacent to the gate of one of the n-channel metal-oxide-semiconductor transistors in its cross-coupled inverters in accordance with the present invention.

FIGS. 22 and 23 show memory element arrangements in which a single nonlinear high-impedance two-terminal element is located adjacent to one of the transistor gates. In FIG. 22, nonlinear high-impedance two-terminal element 202 protects the gate of transistor 168. In FIG. 23, nonlinear high-impedance two-terminal element 204 protects the gate of transistor 166. This type of arrangement may be used to provide soft error upset protection when real estate and layout constraints prevent more extensive deployment of nonlinear high-impedance two-terminal elements.

Figure 24:
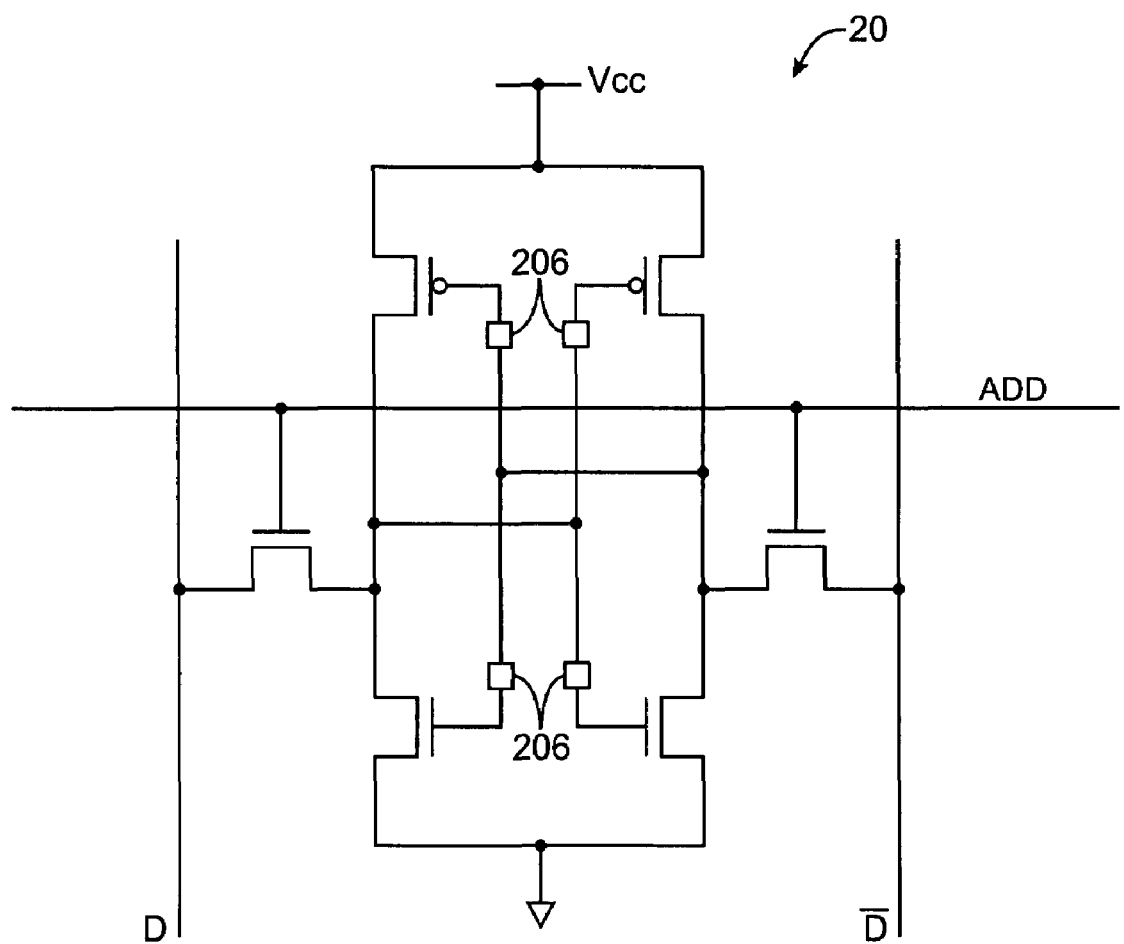
FIG. 24 is a diagram of an illustrative volatile memory element with nonlinear high-impedance two-terminal elements formed adjacent to both of the gates of the n-channel metal-oxide-semiconductor transistors and both of the gates of the p-channel metal-oxide-semiconductor transistors in its cross-coupled inverters in accordance with the present invention.

FIG. 24 shows a memory element arrangement in which nonlinear high-impedance two-terminal elements 206 are located adjacent to all four inverter gates in the memory element. This type of arrangement may be preferred over the arrangement of FIG. 17 due to layout considerations, while providing a similar level of soft error upset immunity.

Figure 25:
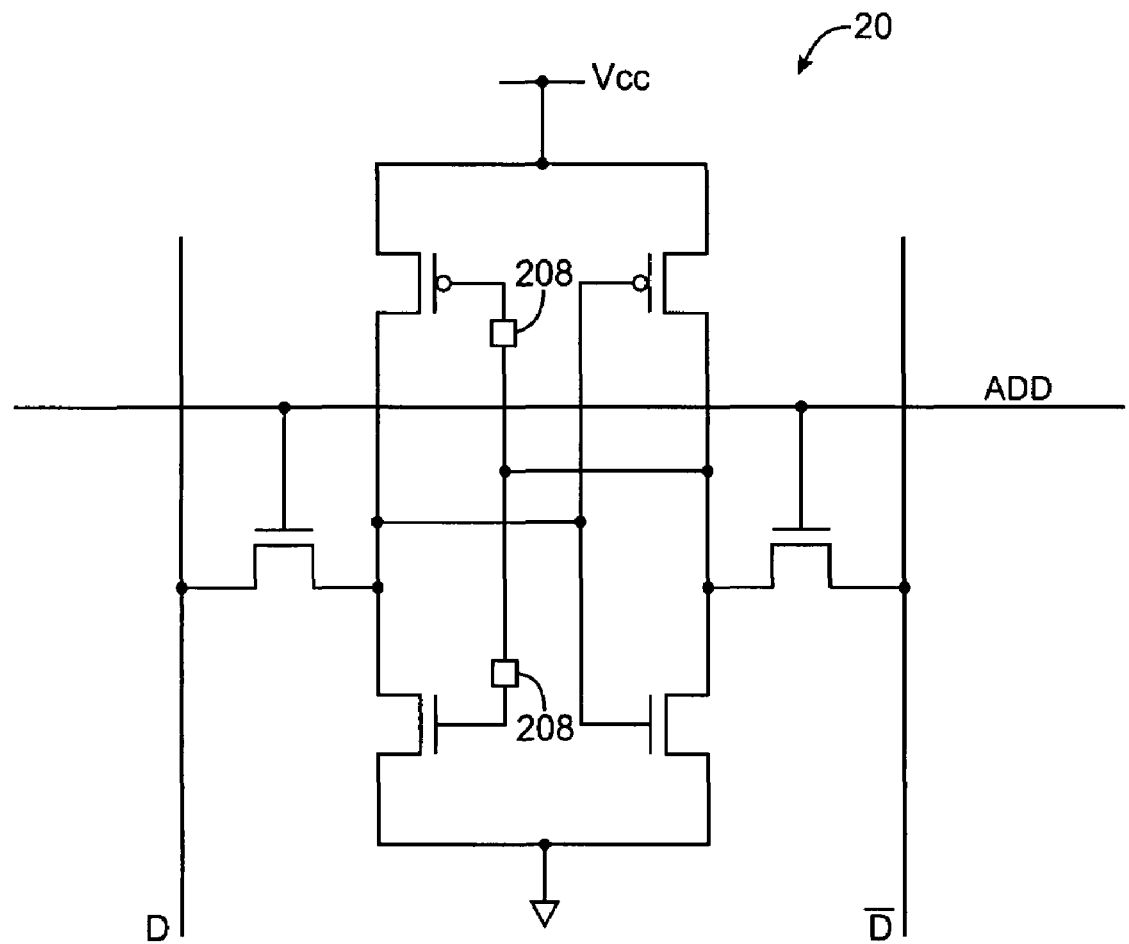
FIG. 25 is a diagram of an illustrative volatile memory element with a nonlinear high-impedance two-terminal element formed adjacent to the gate of one of the n-channel metal-oxide-semiconductor transistors and with a nonlinear high-impedance two-terminal element formed adjacent to the gate of one of the p-channel metal-oxide-semiconductor transistors in its cross-coupled inverters in accordance with the present invention.

FIG. 25 shows a memory element arrangement in which nonlinear high-impedance two-terminal elements 208 are located at the gates of the two transistors in the left-hand inverter in the memory element 20.

Figure 26:
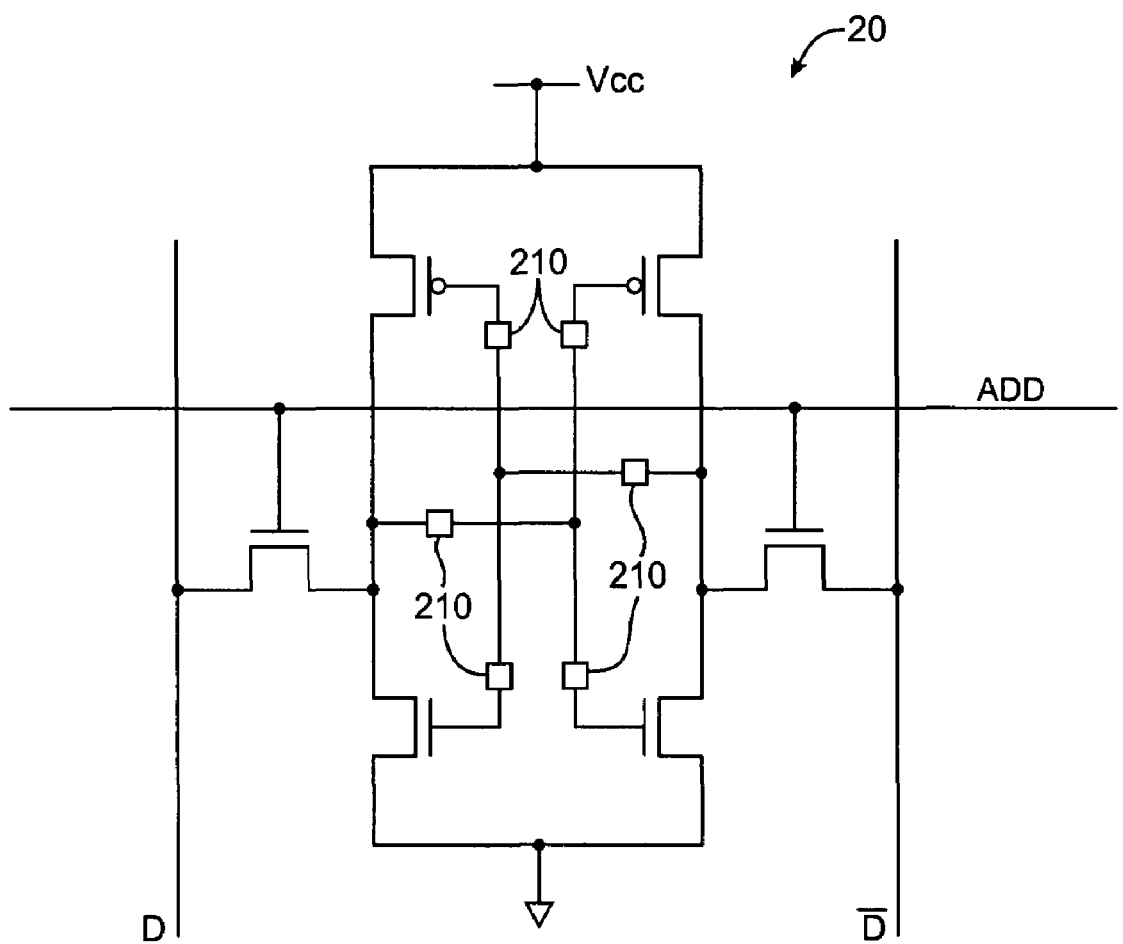
FIG. 26 is a diagram of an illustrative volatile memory element with six nonlinear high-impedance two-terminal element protecting the gates of the transistors in its cross-coupled inverters in accordance with the present invention.

A memory element arrangement in which six nonlinear high-impedance two-terminal elements 210 are provided is shown in FIG. 26. Because there are more elements 210 in the arrangement of FIG. 26 than in the arrangement of FIG. 17, elements 210 can have lower impedances than the elements 154 and 156.

Figure 27:
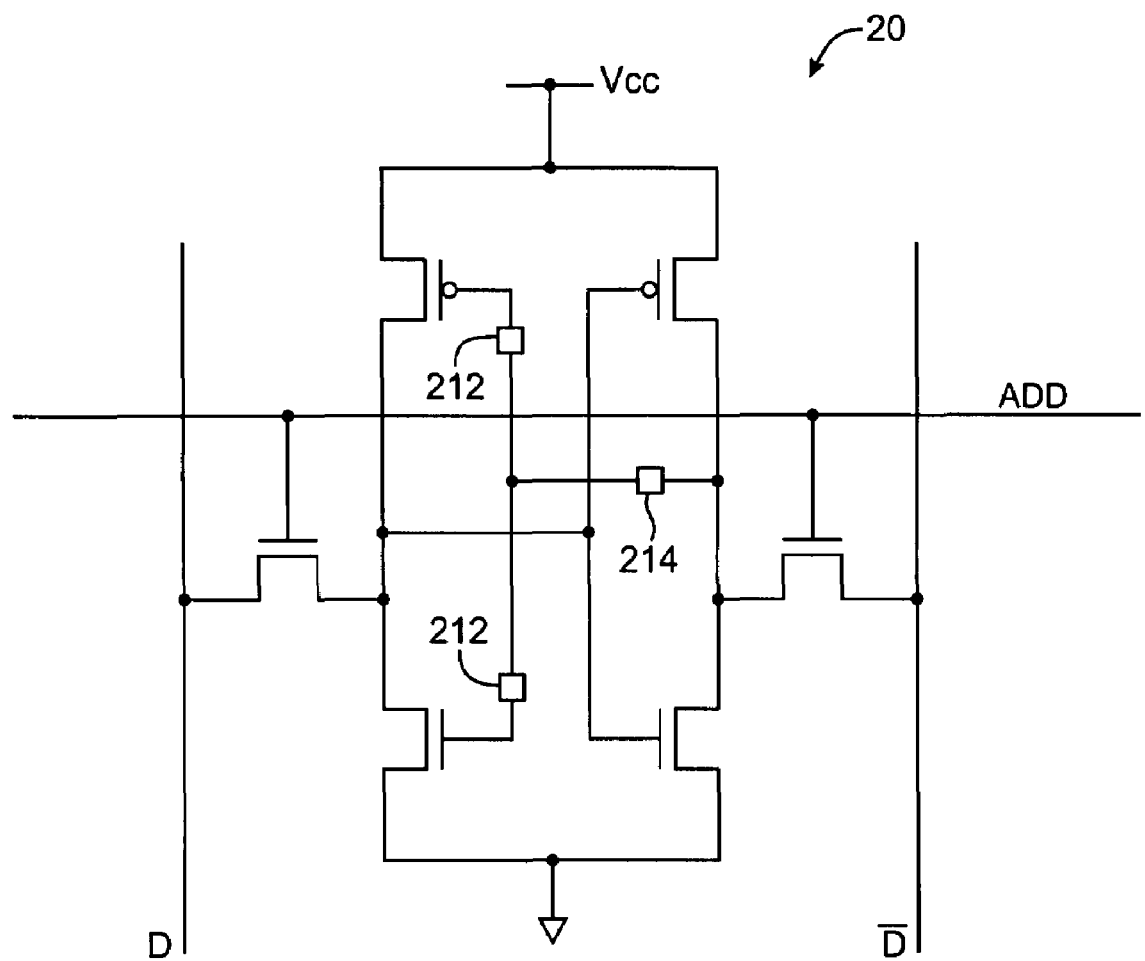
FIG. 27 is a diagram of an illustrative volatile memory element with two nonlinear high-impedance two-terminal elements protecting the gates of the transistors in one of its cross-coupled inverters and a single nonlinear high-impedance two-terminal element that protects both of these gates in accordance with the present invention.

In FIG. 27, a memory element arrangement is shown that uses three nonlinear high-impedance two-terminal elements.

Nonlinear high-impedance two-terminal elements 212 protect the gates of the transistors in the left-hand inverter of the memory element. Nonlinear high-impedance two-terminal element 214, which is connected between the output of the right-hand inverter and the input of the left-hand inverter, further protects these gates.

Figure 28:
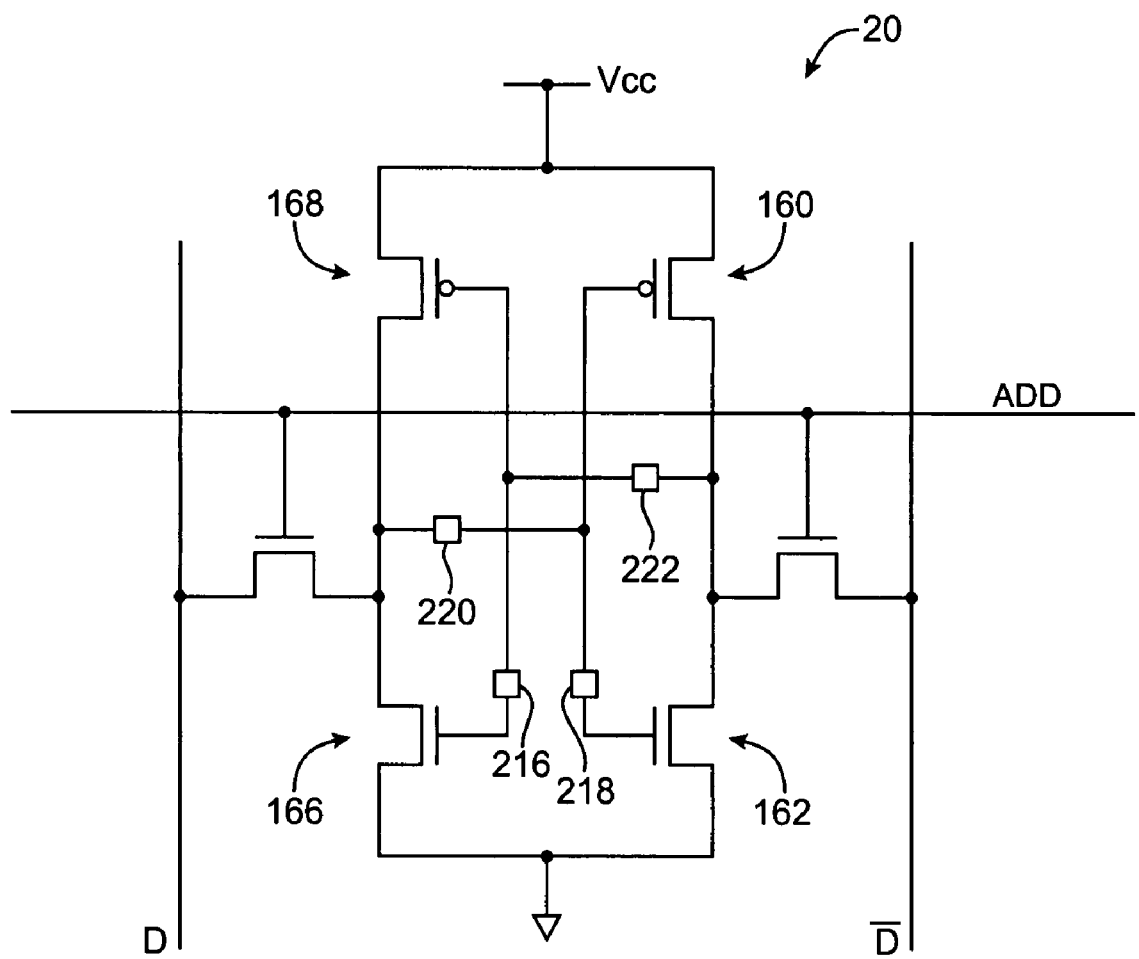
FIG. 28 is a diagram of an illustrative volatile memory element with two nonlinear high-impedance two-terminal elements protecting the gates of the n-channel metal-oxide-semiconductor transistors and two of the nonlinear high-impedance two-terminal elements connected between the outputs and inputs of its cross-coupled inverters in accordance with the present invention.

Four nonlinear high-impedance two-terminal elements are used to protect the memory element 20 in the illustrative arrangement of FIG. 28. Nonlinear high-impedance two-terminal element 216 is located adjacent to the gate of transistor 166. Nonlinear high-impedance two-terminal element 218 is located adjacent to the gate of transistor 162. Nonlinear high-impedance two-terminal element 220 protects the gates of transistors 160 and 162 in the right-hand inverter in the memory element 20. Nonlinear high-impedance two-terminal element 222 protects the gates of transistors 168 and 166 in the left-hand inverter in the memory element 20.

Figure 29:
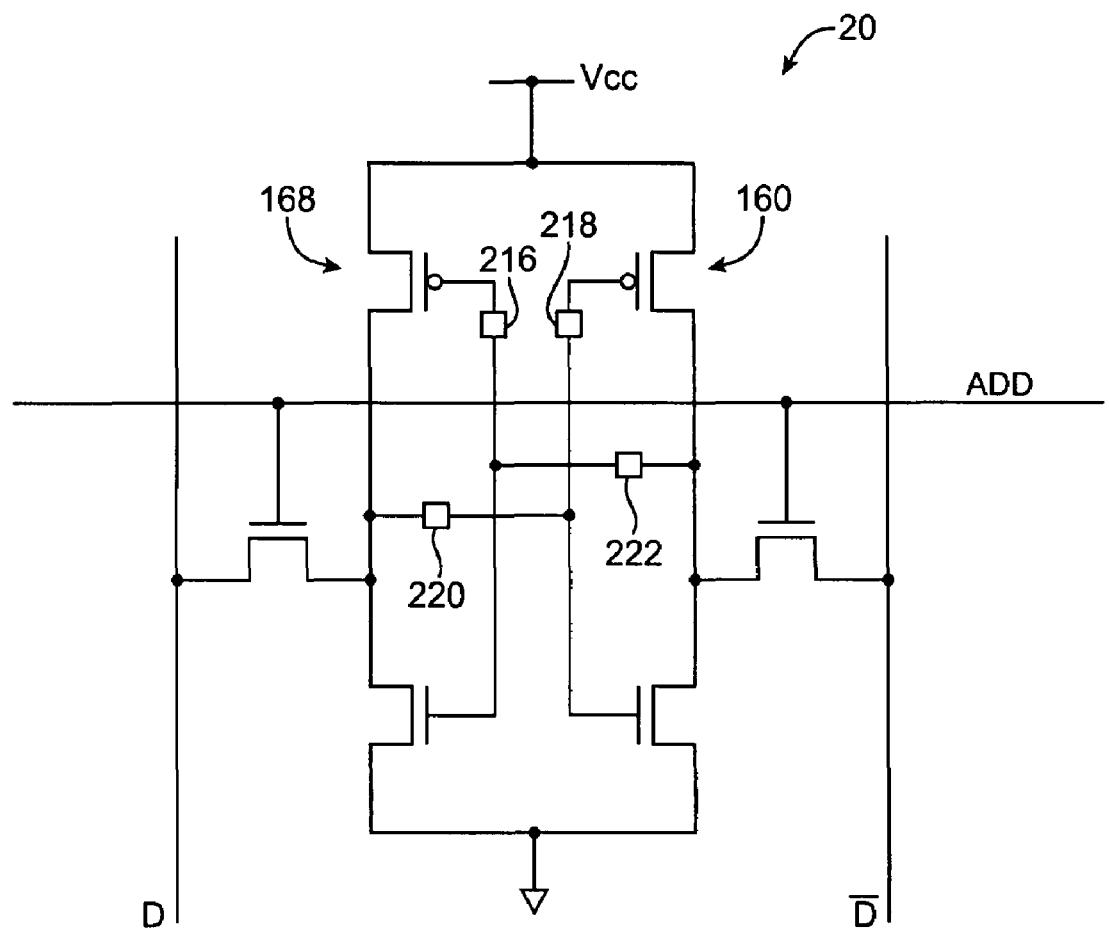
FIG. 29 is a diagram of an illustrative volatile memory element with two nonlinear high-impedance two-terminal elements protecting the gates of the p-channel metal-oxide-semiconductor transistors and two of the nonlinear high-impedance two-terminal elements connected between the outputs and inputs of its cross-coupled inverters in accordance with the present invention.

The arrangement of FIG. 29 is similar to that of FIG. 28, except that nonlinear high-impedance two terminal elements 216 and 218 are located adjacent to the gates of transistors 168 and 160 in memory element 20, respectively.

Figure 30:
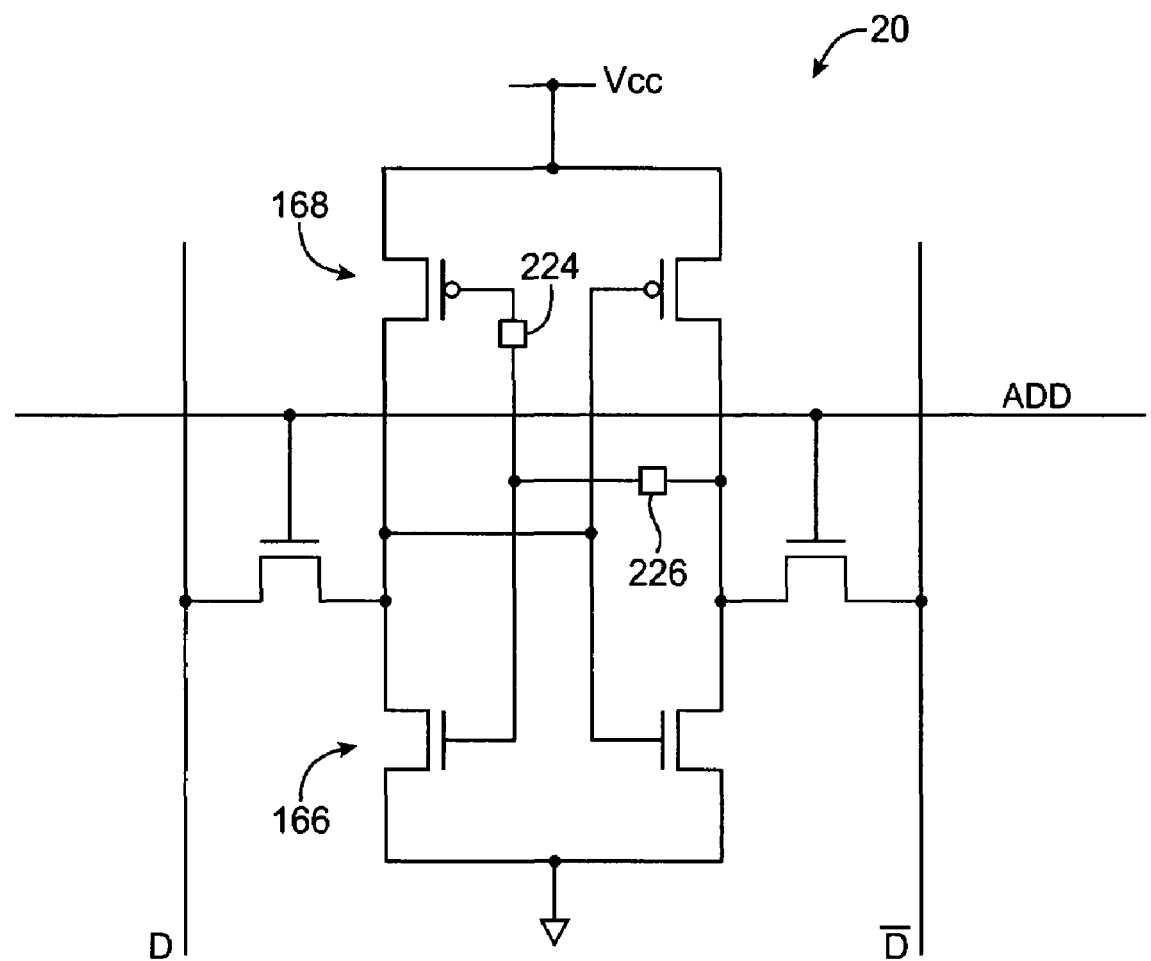
FIG. 30 is a diagram of an illustrative volatile memory element with two nonlinear high-impedance two-terminal elements, one of which is formed adjacent to the gate of one of the p-channel metal-oxide-semiconductor transistors and one of which is connected between the output of one of its cross-coupled inverters and the input of the other of its cross-coupled inverters in accordance with the present invention.

FIG. 30 shows an arrangement in which memory element 20 has a nonlinear high-impedance two-terminal element 224 that is located adjacent to the gate of transistor 168. Nonlinear high-impedance two-terminal element 226 is used to protect the gates of both transistors 168 and 166.

Figure 31:
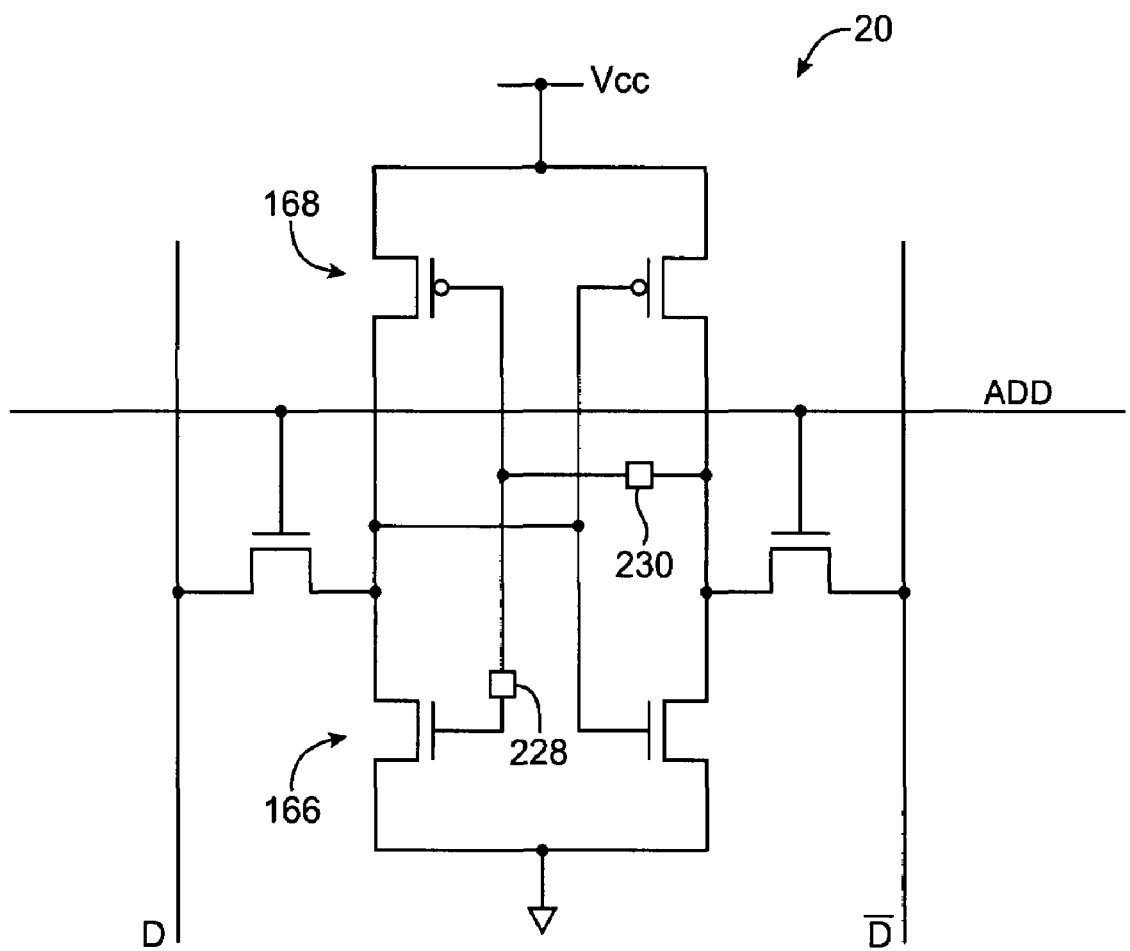
FIG. 31 is a diagram of an illustrative volatile memory element with two nonlinear high-impedance two-terminal elements, one of which is formed adjacent to the gate of one of the n-channel metal-oxide-semiconductor transistors and one of which is connected between the output of one of its cross-coupled inverters and the input of the other of its cross-coupled inverters in accordance with the present invention.

In the arrangement of FIG. 31, memory element 20 has a nonlinear high-impedance two-terminal element 228 that is located adjacent to the gate of transistor 166. Nonlinear high-impedance two-terminal element 230 is used to protect the gates of both transistors 168 and 166.

Figure 32:
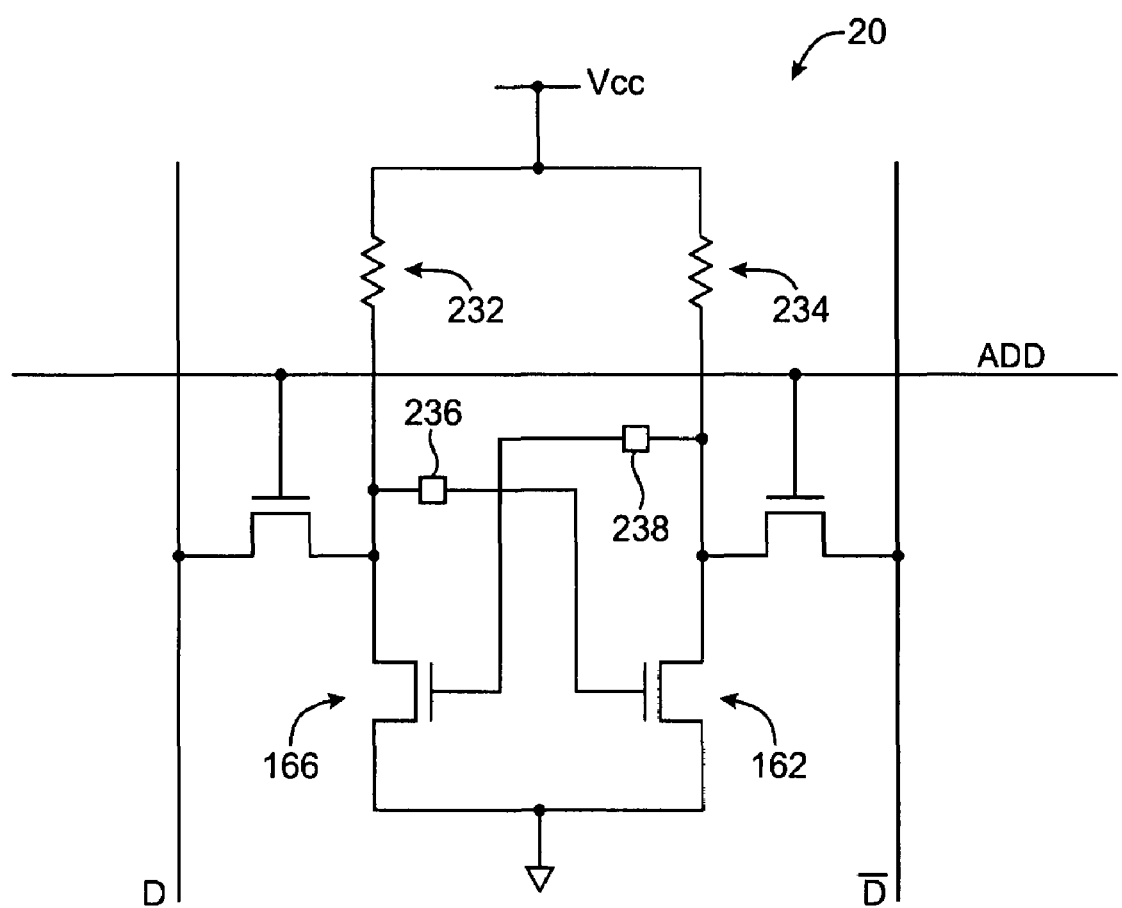
FIG. 32 is a diagram of an illustrative volatile memory element using resistive loads in which nonlinear high-impedance two-terminal elements are connected to a node located between the resistive load and the n-channel metal-oxide-semiconductor transistor in each of its cross-coupled inverters in accordance with the present invention.

FIG. 32 shows an illustrative memory cell 20 that uses resistors as loads for its inverters. The left-hand inverter in the memory cell of FIG. 32 has a resistor 232 and a NMOS transistor 166. The right-hand inverter in the memory cell of FIG. 32 has a resistor 234 and NMOS transistor 162. Nonlinear high-impedance two-terminal element 236 is located adjacent to the gate of transistor 162 and provides soft error upset immunity for the right-hand inverter. Nonlinear high-impedance two-terminal element 238 is located adjacent to the gate of transistor 166 and provides soft error upset immunity for the left-hand inverter.

Figure 33:
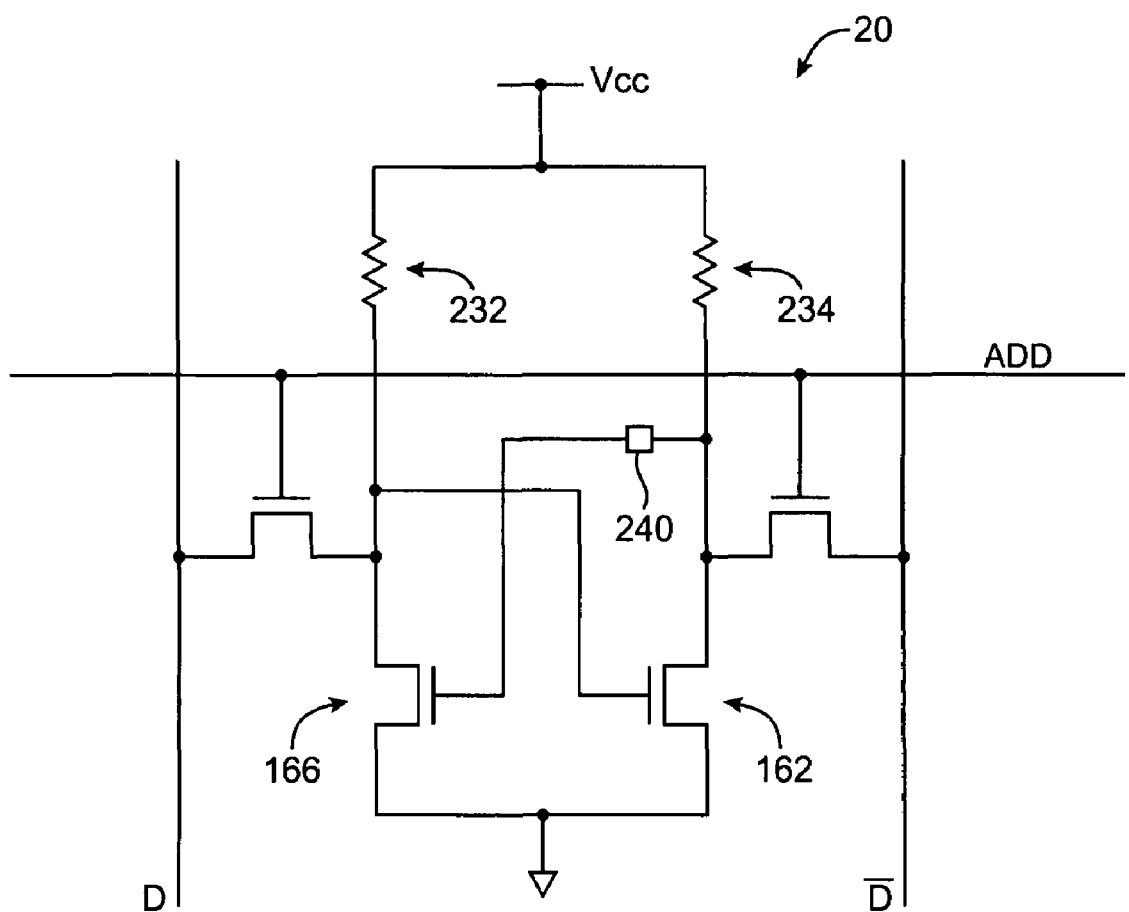
FIG. 33 is a diagram of an illustrative volatile memory element using resistive loads in which a single nonlinear high-impedance two-terminal element is connected to a node located between the resistive load and the n-channel metal-oxide-semiconductor transistor in one of its cross-coupled inverters in accordance with the present invention.

In the arrangement of FIG. 33, only a single nonlinear high-impedance two-terminal element is used in memory cell 20. Nonlinear high-impedance two-terminal element 240 is located adjacent to the gate of transistor 166 and provides soft error upset immunity for the left-hand inverter.

Figure 34:
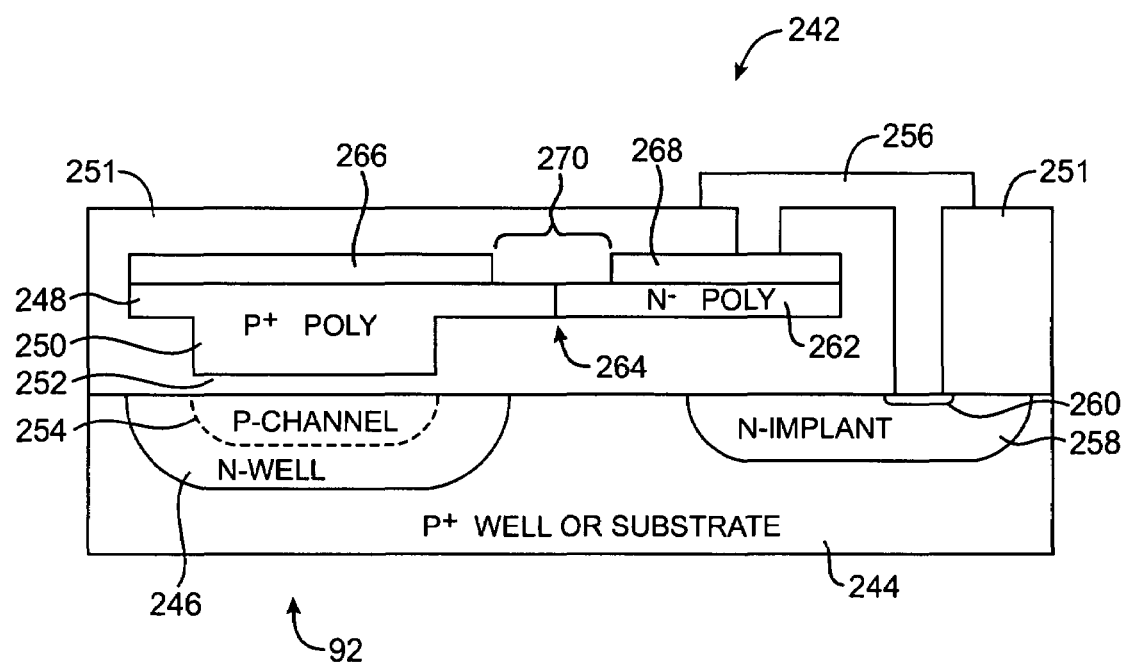
FIG. 34 is a cross-sectional diagram of a portion of a memory element having a nonlinear high-impedance two-terminal element formed from a p-n diode in accordance with the present invention.

A cross-sectional view of portions 242 of an illustrative memory element 20 is shown in FIG. 34. The structures shown in the cross-section of FIG. 34 include a silicon substrate (well) 244 with p+ doping. In general, silicon substrates or wells of any doping type may be used in forming an integrated circuit in accordance with the present invention.

The p+ source and p+ drain of a p-channel transistor such as PMOS transistor 92 of FIG. 9 are formed within n-well 246. N-well 246 is typically lightly doped. P+ polysilicon 248 is used to form the gate 250 for this transistor. Gate oxide 252 ($SiO_2$) lies under gate 250. In FIG. 9, the gate of transistor 92 is labeled "G". Silicon oxide 251 serves as an electrical insulator.

In the cross-sectional view of FIG. 34, the long dimension of the gate of transistor 92 (its width) runs from left to right in the page. The short dimension of the gate (its length) runs perpendicular to the page. The dotted line 254 shows where the p-type channel is formed between the p-type source and p-type drain (source-drains) of the transistor 92. The source and drain implants lie farther into the page and farther out of the page than the p-type channel 254 and therefore do not appear in cross-section of FIG. 34.

Contact metal 256 is used to provide a conductive pathway to the n-type region 258. N+ region 260 is provided so that metal 256 makes and ohmic contact with n-type region 258. Metal 256 may be any suitable metal, metal alloy, or combinations of metals and/or alloys that is available for forming metal interconnects in a semiconductor fabrication process.

N-type polysilicon layer 262 forms a p-n junction 264 with p+ polysilicon 248. A silicide layer is provided on top of the polysilicon. In a typical silicide formation process, a thin layer of titanium is deposited on polysilicon 248 and 262 and heat is applied to form titanium silicide. Polysilicon that is coated with silicide such as polysilicon 248 and polysilicon 262 is sometimes referred to as silicided polysilicon.

Silicide 266 covers some of p-type polysilicon 248. Silicide 268 covers some of n-type polysilicon 262. In region 270, there is no silicide. This gap allows the p-n junction 264 to form a diode. The diode formed by the p-n junction 264 serves as a nonlinear high-impedance two-terminal element for the memory element.

The n-implant 258 of FIG. 34 represents the source-drain region of a controlling transistor such as the source-drain of one of the two transistors in the cross-coupled inverter or an addressing transistor. The n-implant 258 may, for example, form the source-drain (labeled "S-D") of controlling transistor 100 in FIG. 9. The source-drain region 258 is electrically connected to the gate 250 of transistor 92 by a conductive path formed from metal 256, n-type polysilicon 262, and p-type polysilicon 248. The silicide 266 and 268 on the polysilicon reduces sheet resistance and makes the silicided polysilicon suitable for serving as an interconnect structure. The portion 270 of polysilicon 248 and 262 is unsilicided, so the p-n junction formed by the unsilicided polysilicon 248 and 262 forms a nonlinear high-impedance two-terminal element such as element 106 of FIG. 9 or element 104 of FIG. 9.

Figure 35:
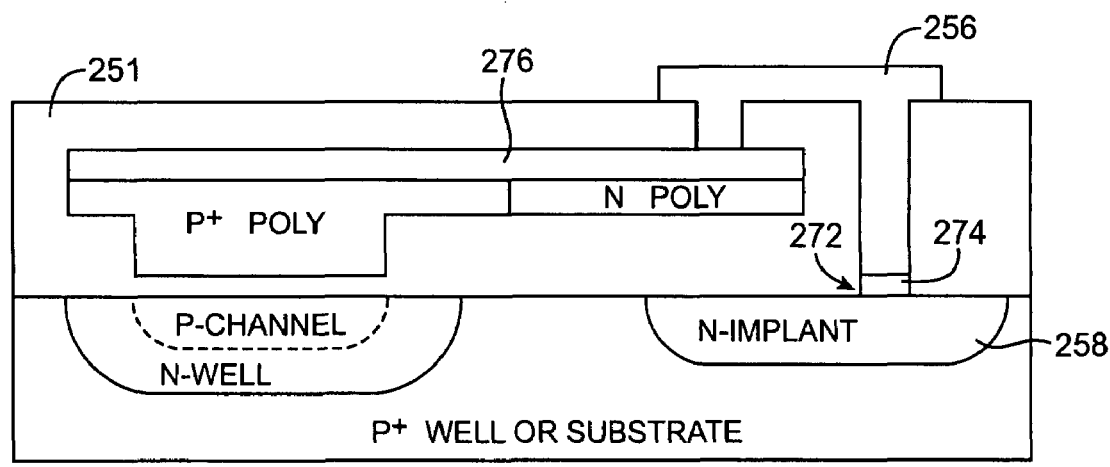
FIG. 35 is a cross-sectional diagram of a portion of a memory element having a nonlinear high-impedance two-terminal element formed from a Schottky diode in accordance with the present invention.

In the example of FIG. 34, the nonlinear high-impedance two-terminal element for the memory element 20 is formed using a diode based on a p-n junction. FIG. 35 shows an arrangement that may be used to form a nonlinear high-impedance two-terminal element from a Schottky diode. As shown in FIG. 35, a Schottky diode is formed at interface 272. Metal 256 can form a direct contact with the n-silicon of region 258 at interface 272 or one or more intervening layers of metal such as metal 274 can be used to form the metal-to-silicon interface (as shown in the example of FIG. 35). As one example, metal 274 may be titanium and metal 256 may be copper. Unlike region 258 of FIG. 34, which has highly-doped region 260 for forming an ohmic contact with metal 256, there is no highly-doped region in region 258 of FIG. 35, so a Schottky diode is formed at interface 272. In the arrangement of FIG. 35, it is not necessary to form a gap in silicide 276, because the Schottky diode formed between the metal (274 and/or 256) and silicon 258 serves as the nonlinear high-impedance two-terminal element.

Figure 36:
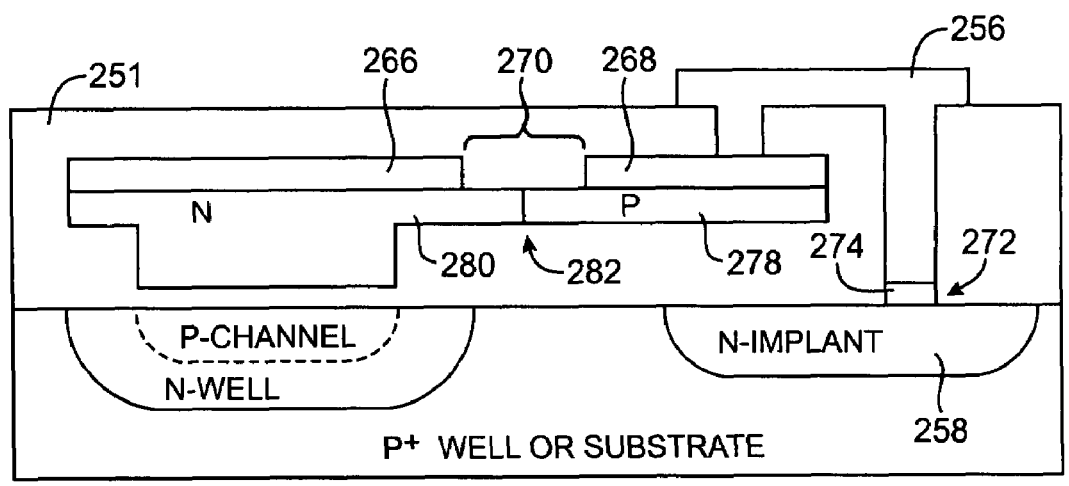
FIG. 36 is a cross-sectional diagram of a portion of a memory element having a nonlinear high-impedance two-terminal element formed from a p-n diode connected in series with a Schottky diode in accordance with the present invention.

If desired, the p-n junction arrangement of FIG. 34 and the Schottky diode arrangement of FIG. 35 may be used to form a nonlinear high-impedance two-terminal element with a back-to-back diode configuration. This type of structure is shown in FIG. 36. As shown in FIG. 36, a Schottky diode is formed between metal 274 and the silicon of source-drain region 258. The metal 256 connects this diode to the diode formed by the p-n junction 282. A gap 270 is formed in the silicide layers 266 and 268, which allows the diode at junction 282 to be formed from polysilicon layers 280 and 278. The p-n junction diode and the Schottky diode of FIG. 36 may form a back-to-back diode arrangement for a nonlinear high-impedance two-terminal-element or the p-n junction diode and Schottky diode may each serve as a separate single-diode-based nonlinear high-impedance two-terminal element.

Examples of suitable structures that may be used to form the nonlinear high-impedance two-terminal elements of the memory element 20 are shown in FIGS. 37-44. In FIGS. 37-44, silicon oxide 251 (or other suitable dielectric) serves as an electrical insulator. Metal 256 (or other suitable conductor) serves as a conductive pathway (e.g., from the source-drain of a controlling transistor that is not shown in FIGS. 37-44). The polysilicon layer on the left side of FIGS. 37-44 (such as polysilicon 288 in FIG. 37) is connected to polysilicon gate material such as gate 250 in FIG. 34 (not shown in FIGS. 37-44). Silicide 284 and 286 serves to reduce sheet resistance in the polysilicon layers on which it is formed. In the examples of FIGS. 37-44, gaps 292 are formed in the silicide layer, which forces current through the polysilicon under the gap and allows formation of the nonlinear high-impedance two-terminal elements.

Figure 37:
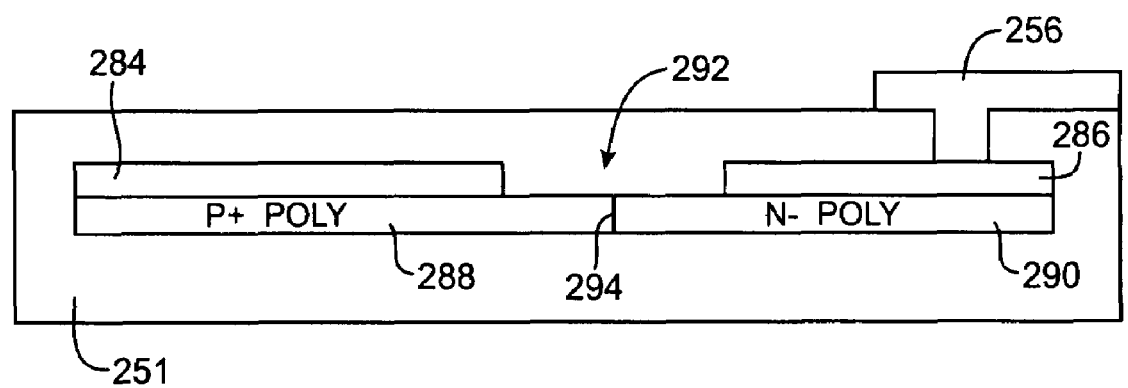
FIG. 37 is a cross-sectional diagram of a portion of a memory element with a nonlinear high-impedance two-terminal element formed from a p-n diode that is forward biased during discharge events in accordance with the present invention.

In the configuration of FIG. 37, a nonlinear high-impedance two-terminal element for the memory element 20 is formed using p+ polysilicon 288 and n− polysilicon 290. The silicide gap 292 between silicide 284 and 286 forces current through interface 294, so that polysilicon 288 and polysilicon 290 form a p-n junction.

Figure 38:
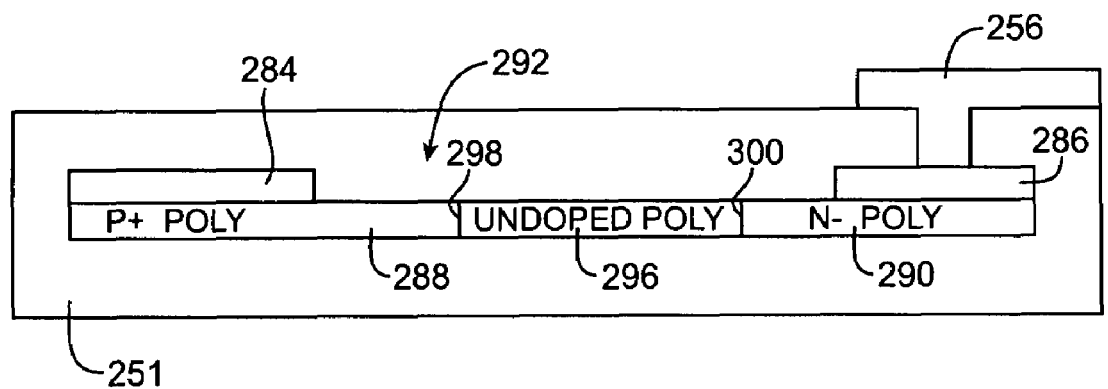
FIG. 38 is a cross-sectional diagram of a portion of a memory element with a nonlinear high-impedance two-terminal element formed from a p-i-n diode that is forward biased during discharge events in accordance with the present invention.

In the configuration of FIG. 38, a region of undoped polysilicon 296 is formed between p+ polysilicon 288 and n− polysilicon 290. The silicide gap 292 extends over part of polysilicon 288, polysilicon 296, and part of polysilicon 290, so current is forced through junctions 298 and 300. The structure of FIG. 38 forms a p-i-n diode, which serves as a nonlinear high-impedance two-terminal element. If desired, other doping types and levels can be used for the intermediate region 296 (e.g., p−, etc.).

Figure 39:
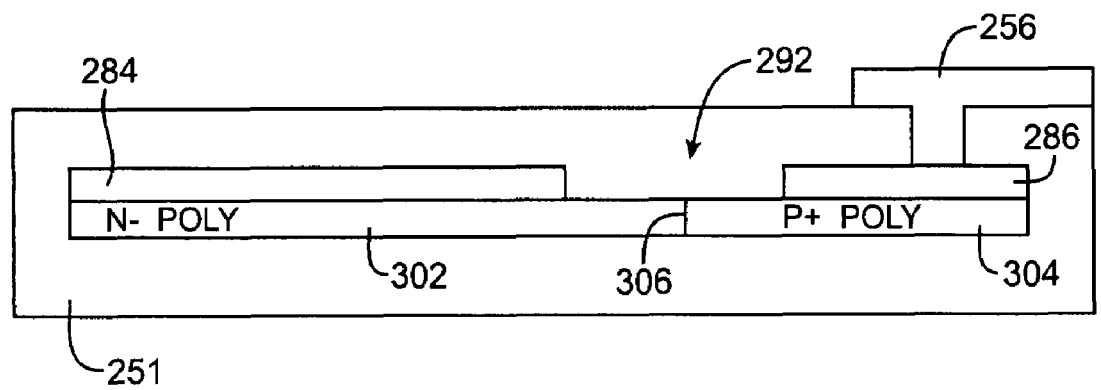
FIG. 39 is a cross-sectional diagram of a portion of a memory element with a nonlinear high-impedance two-terminal element formed from a p-n diode that is reverse biased during discharge events in accordance with the present invention.

If the n-type and p-type dopings of FIG. 37 are reversed, a structure of the type shown in FIG. 39 is produced. A p-n junction is formed under silicide gap 292, so current is forced through the junction 306 between n-type polysilicon 302 and p-type polysilicon 304.

Figure 40:
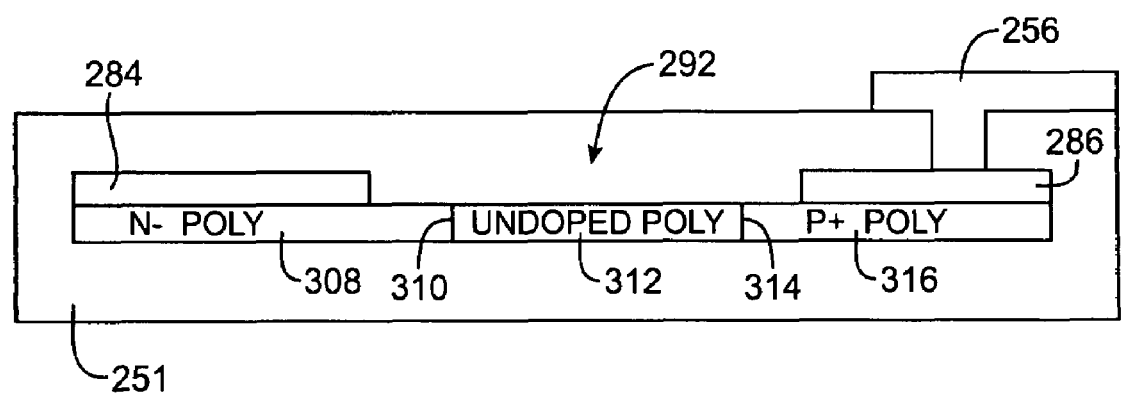
FIG. 40 is a cross-sectional diagram of a portion of a memory element with a nonlinear high-impedance two-terminal element formed from a p-i-n diode that is reverse biased during discharge events in accordance with the present invention.

If the n-type and p-type dopings of FIG. 38 are reversed, a structure of the type shown in FIG. 40 is produced. In the arrangement of FIG. 40, the gap 292 between silicide 284 and 286 forces current through the junction 310 between n− polysilicon 308 and undoped polysilicon 312 and the junction 314 between undoped polysilicon 312 and p+ polysilicon 316. Polysilicon 316, polysilicon 312, and polysilicon 308 form a nonlinear high-impedance two-terminal element based on a p-n diode.

Figure 41:
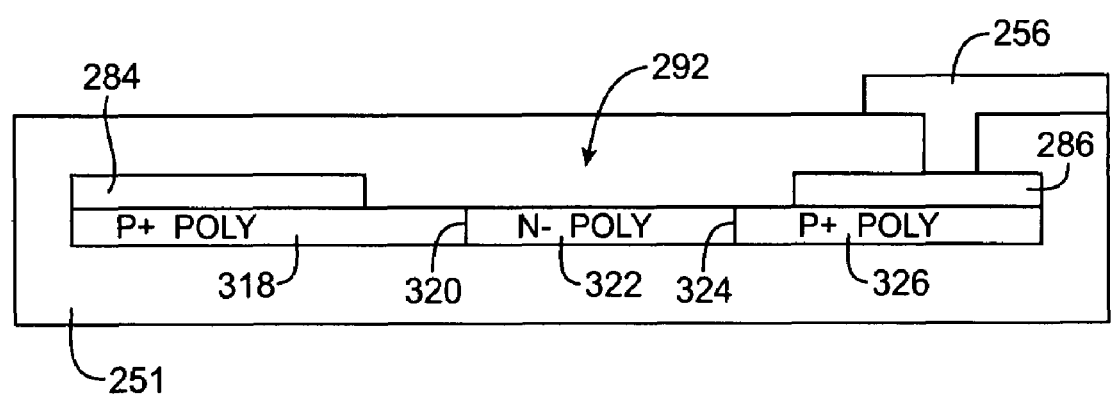
FIG. 41 is a cross-sectional diagram of a portion of a memory element with a nonlinear high-impedance two-terminal element formed from back-to-back diodes in a common cathode configuration in accordance with the present invention.

An illustrative arrangement in which a nonlinear high-impedance two-terminal element is formed from two back-to-back diodes is shown in FIG. 41. The gap 292 between silicide layer 284 and silicide layer 286 forces current through junction 320 between p+ polysilicon 318 and n− polysilicon 322 and through junction 324 between n− polysilicon 322 and p+ polysilicon 326. The back-to-back diodes share a common cathode (n− region 322).

Figure 42:
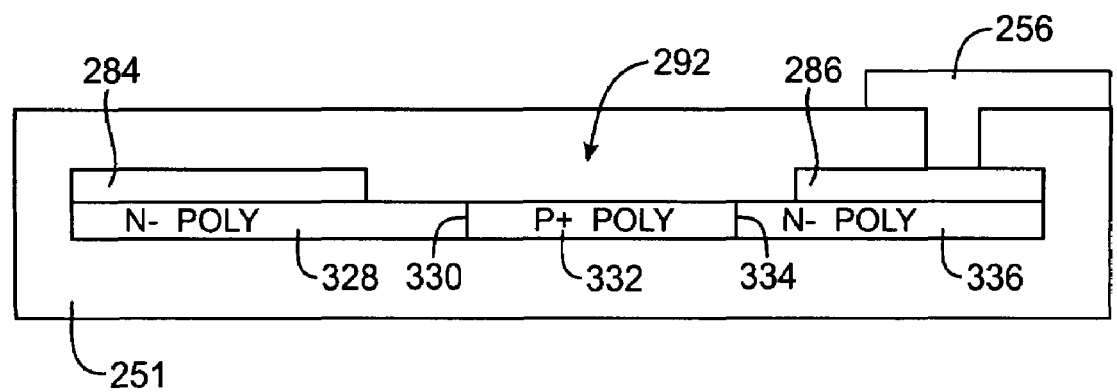
FIG. 42 is a cross-sectional diagram of a portion of a memory element with a nonlinear high-impedance two-terminal element formed from back-to-back diodes in a common anode configuration in accordance with the present invention.

A common-anode back-to-back diode nonlinear high-impedance two-terminal element is shown in FIG. 42. Gap 292 in silicide 284 and 286 forces current through junction 330 between n− polysilicon layer 328 and p+ polysilicon 332 and through junction 334 between p+ polysilicon 332 and n− polysilicon 336. Polysilicon 328 and polysilicon 332 form a first diode. Polysilicon 332 and polysilicon 336 form a second diode. The diodes are oriented back to back in a common anode configuration.

Figure 43:
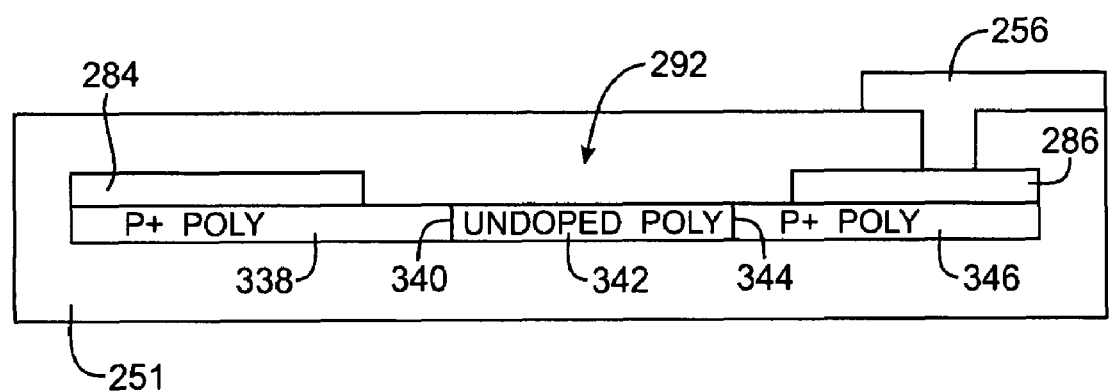
FIG. 43 is a cross-sectional diagram of a portion of a memory element with a nonlinear high-impedance two-terminal element formed from two p-type regions separated by an undoped semiconductor region in accordance with the present invention.

FIG. 43 shows another suitable arrangement that may be used for a nonlinear high-impedance two-terminal element. In the arrangement of FIG. 43, gap 292 in silicide 284 and 286 forces current through the junction 340 between p+ polysilicon layer 338 and undoped polysilicon 342 and through junction 344 between undoped polysilicon 342 and p+ polysilicon 346. Because polysilicon 342 is undoped, the junction 340 is not a p-n junction and the junction 344 is not a p-n junction. The impedance of a nonlinear structure of the type shown in FIG. 43 will therefore generally not be as large as when a back-to-back diode structure is used. Nevertheless, layout constraints or other design constraints may make it desirable to use the nonlinear high-impedance two-terminal element of FIG. 43.

Figure 44:
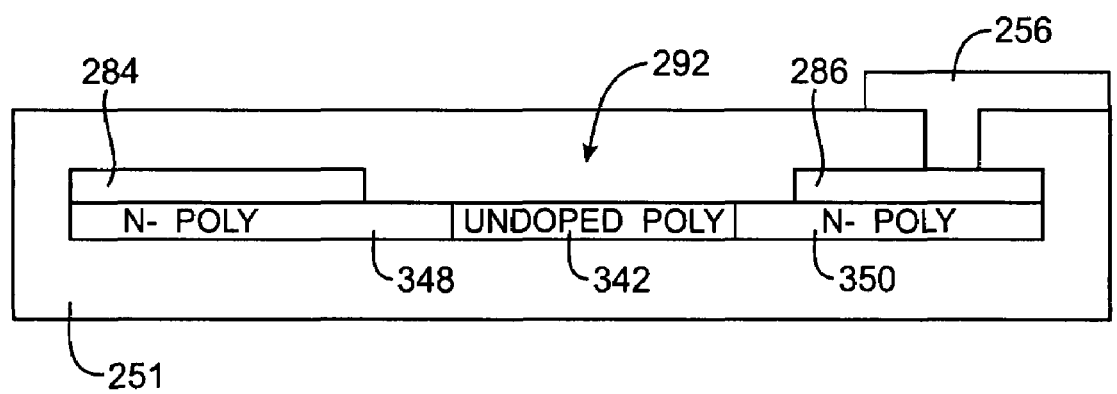
FIG. 44 is a cross-sectional diagram of a portion of a memory element with a nonlinear high-impedance two-terminal element formed from two n-type regions separated by an undoped semiconductor region in accordance with the present invention.

FIG. 44 shows a nonlinear high-impedance two-terminal element that is similar to the element of FIG. 43, but that has n− polysilicon regions 348 and 350 instead of p+ polysilicon regions 338 and 346. As with the nonlinear element of FIG. 43, the impedance of the nonlinear structure of FIG. 44 will generally not be as large as when a back-to-back diode structure is used.

The examples of FIGS. 37-44 involve the use of various doping levels. If desired, other doping levels may be used. For example, p− doping levels may be used in place of p+ doping levels in the polysilicon and n+doping levels may be used in place of the n− doping levels in the polysilicon. The doping levels shown in the drawings are merely illustrative.

When memory elements 20 are used in an integrated circuit, the high impedance provided by the nonlinear high-impedance two-terminal elements increases the memory element's switching time $T_{SWITCH}$. In integrated circuits in which write and read speeds are important (e.g., memories), care should be taken to increase $T_{SWITCH}$ as little as possible, generally ensuring that $T_{SWITCH}$ is greater than $T_{LIFETIME}$, but not significantly more. This ensures that soft error upset immunity is provided without unnecessarily decreasing performance. In integrated circuits such as programmable logic device integrated circuits, memory elements 20 are used to store configuration data, so read times are generally not critical. Write speed is also less critical in programmable logic devices than in circuits such as memory where high speed performance is of particular importance.

Figure 45:
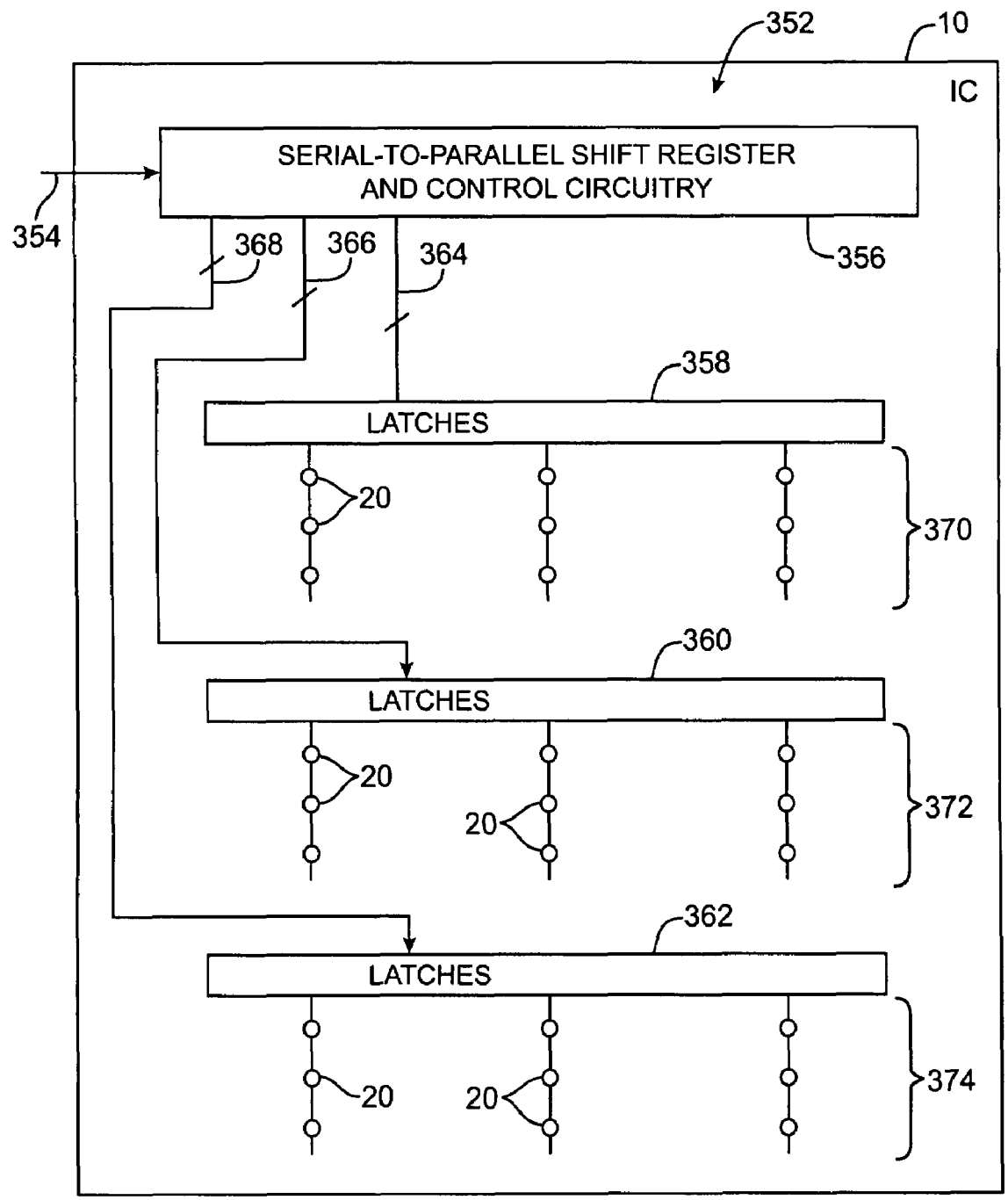
FIG. 45 is a diagram of illustrative circuitry that may be used to load memory elements containing nonlinear high-impedance two-terminal elements in accordance with the present invention.

Moreover, excessively slow write speeds can be avoided by programming memory elements 20 in parallel. Illustrative circuitry 352 that may be used to program memory elements 20 in parallel is shown in FIG. 45. As shown in FIG. 45, configuration data is provided to circuitry 352 via path 354. Circuitry 352 includes serial-to-parallel shift register and control circuitry 356. Serial-to-parallel shift register circuitry 356 receives the configuration data from path 354 in a serial format and provides corresponding parallel data on lines such as lines 364, 366, and 368 in sequence. Control circuitry in circuit 356 produces signals such as address signals, latch enable signals, and clock signals for controlling the latches and memory elements in circuitry 352. Memory elements 20 are arranged in multiple subarrays, which are sometimes referred to as "banks". A set of latches is associated with the memory elements of each bank. In the example of FIG. 45, latches 358 are associated with the memory elements 20 in bank 370, latches 360 are associated with the memory elements 20 in bank 372, and latches 362 are associated with the memory elements 20 in bank 374.

Serial-to-parallel shift register circuitry 356 preferably provides configuration data to the set of latches of each bank in parallel (i.e., on parallel lines). Each set of latches loads the configuration data that has been provided in parallel by circuitry 356 into its associated bank of memory elements. This type of arrangement helps to overcome the relatively slow loading speed of the memory elements 20, because multiple sets of latches can load their configuration data into their respective banks of memory elements at the same time.

The loading speeds of the latches and memory elements can be represented by loading time constants. A set of latches with a time constant of 100 ns (as an example) can be loaded with configuration data in 100 ns. A row of memory elements 20 in an associated bank may have a time constant of 300 ns (as an example), so that the latch-to-memory-element loading process is three times slower than the process of loading the latches from the shift register circuitry.

The disparity between the latch loading time constant and the memory element loading time constant can be used to overcome the relatively slow loading speed of the memory elements 20. The memory elements themselves may be too slow to be loaded directly from the shift register 356, but the shift register can be used to rapidly load three sets of latches with configuration data. The loaded sets of latches, in turn, can load their configuration data into the memory elements. At least some of the sets of latches are loading their configuration data into their associated banks of memory elements at the same time (i.e., during identical or at least overlapping time periods), so the overall rate of loading the memory elements is increased.

A variety of architectures may be used to enhance the loading speed of memory elements 20. With one suitable arrangement, the shift register circuitry loads each set of latches in sequence. For example, serial-to-parallel shift register 356 may first provide configuration data for some of the memory elements in bank 370 to latches 358. While this data is being loaded into the appropriate memory elements in bank 370 (as an example, the second row of memory elements 20 in bank 370), the serial-to-parallel shift register 356 can start providing configuration data to the next bank. In particular, serial-to-parallel shift register 356 can provide configuration data to the latches 360 associated with bank 372. After this data has been provided to latches 360, the serial-to-parallel shift register circuitry 356 can provide configuration data to the latches 362 that are associated with the third bank. Because latches in each bank work independently, the relatively slow writing speed of each individual memory element does not slow down the overall loading process.

In the illustrative scenario in which the loading time constant of the latches is 100 ns and the loading time constant of the memory elements is 300 ns, it is sufficient to divide the memory element array into three banks, as shown in FIG. 45. While the first and second sets of latches are loading their configuration data into their associated banks of memory elements in parallel, the shift register is loading the third set of latches with new configuration data. By the time that the third set of latches has been loaded, the first set of latches will be available for loading with new configuration data.

In effect, this type of arrangement uses a form of time-division multiplexing by sending data to one set of latches while waiting for the other sets of latches to finish the writing process. For optimum throughput, the array of memory elements 20 on integrated circuit 10 is divided into a sufficient number of banks to ensure that serial-to-parallel shift register 356 always has a set of latches available to receive its portion of the configuration data. If the nonlinear high-impedance two-terminal elements slow the write speeds of the memory elements by a relatively large amount, the memory array may be partitioned into a relatively large number of banks, each with an associated set of latches. If the nonlinear high-impedance two-terminal elements slow the write speeds of the memory elements by a relatively small amount, the memory may be partitioned into relatively fewer banks.

Figure 46:
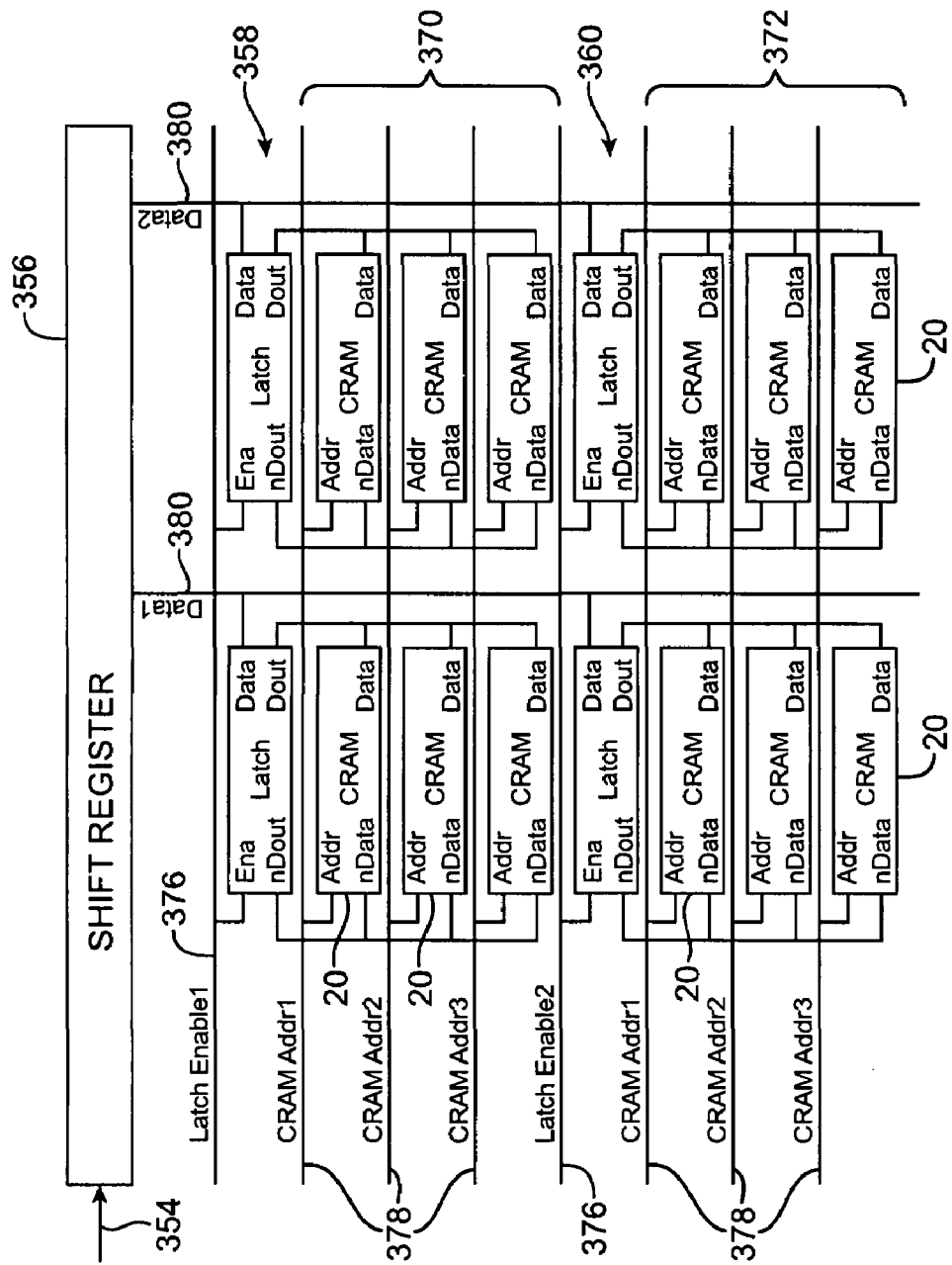
FIG. 46 is a diagram showing illustrative circuitry that may be used to load an array of memory elements using a sequential latch enable approach in accordance with the present invention.

The circuitry that is used to load the memory elements can be based on a number of different loading architectures (e.g., using time-division-multiplexing to load sets of latches in sequence, using loading arrangements with chained sets of latches, etc.). One suitable architecture that may be used is shown in FIG. 46. In the arrangement of FIG. 46, latch enable lines 376 are used to enable latches 358 and 360 for loading. When latch enable line LATCH ENABLE 1 is asserted, data is loaded from shift register 356 to latches 358 via data lines 380. When latch enable line LATCH ENABLE 2 is asserted, data is loaded from shift register 356 to latches 360 via data lines 380. The data that has been loaded into latches 358 is loaded into the memory elements 20 in bank 370. Address lines 378 are used to select which row of memory elements is loaded. The memory elements of bank 372 are associated with latches 360.

Figure 47:
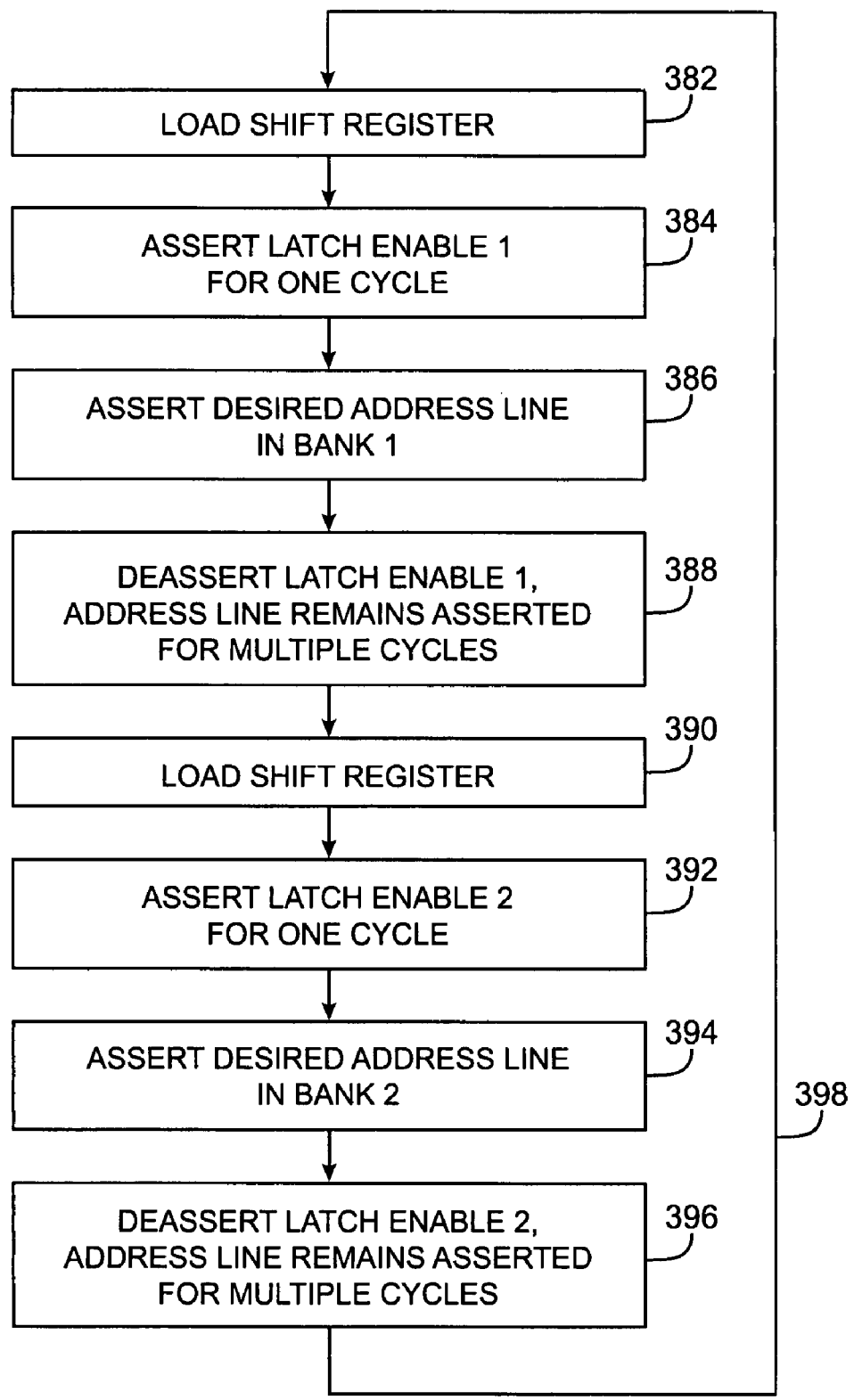
FIG. 47 is a flow chart of illustrative steps involved in loading a memory array of the type shown in FIG. 46 in accordance with the present invention.

Illustrative steps involved in loading data into the memory elements 20 using the circuitry of FIG. 46 are shown in FIG. 47. This example uses two banks of memory elements 20. In general, an integrated circuit 10 may have any suitable number of memory element banks and associated sets of latches.

At step 382, shift register 356 is loaded with configuration data via input 354.

At step 384, the signal LATCH ENABLE 1 is asserted (for one cycle) to load data from shift register 356 into latches 358.

At step 386, an appropriate address line in the first bank (bank 370 in FIG. 46) is asserted. This transfers the configuration data that was provided to latches 358 into a desired row of memory elements 20 in the first bank.

While data is being transferred from the latches 358 (FIG. 46) to the addressed row of memory elements 20 in the first bank, data can be loaded into memory elements 20 in the second bank. By using time-division multiplexing in this way, the relatively slower write speed of the memory elements 20 can be overcome.

In particular, at step 388, LATCH ENABLE 1 is deasserted. The address line in the first bank remains asserted for as many cycles as needed to transfer the data from the first set of latches into the memory elements in the first bank. In the example of FIG. 47, the address line remains asserted for two cycles.

At step 390, the shift register is loaded with another set of configuration data.

At step 392, LATCH ENABLE 2 is asserted (for one cycle), which transfers the configuration data from the shift register into the latches 360 (FIG. 46).

At step 394, an appropriate address line in the second bank of memory elements (i.e., bank 372 of FIG. 46) is asserted to transfer the configuration data from latches 360 to the desired memory elements in the second bank.

At step 396, LATCH ENABLE 2 is deasserted. The address line in the second bank remains asserted until the loading process is complete (i.e., for two cycles in this example).

As shown by line 398, processing loops back to step 382, so that additional configuration data can be loaded. In this type of scheme, the configuration data loading throughput is twice what it would be if there were only a single bank of memory elements and a single corresponding set of latches. If more banks and more latches are used (e.g., three banks, four banks, more than four banks, etc.), throughput will be further enhanced.

Figure 48:
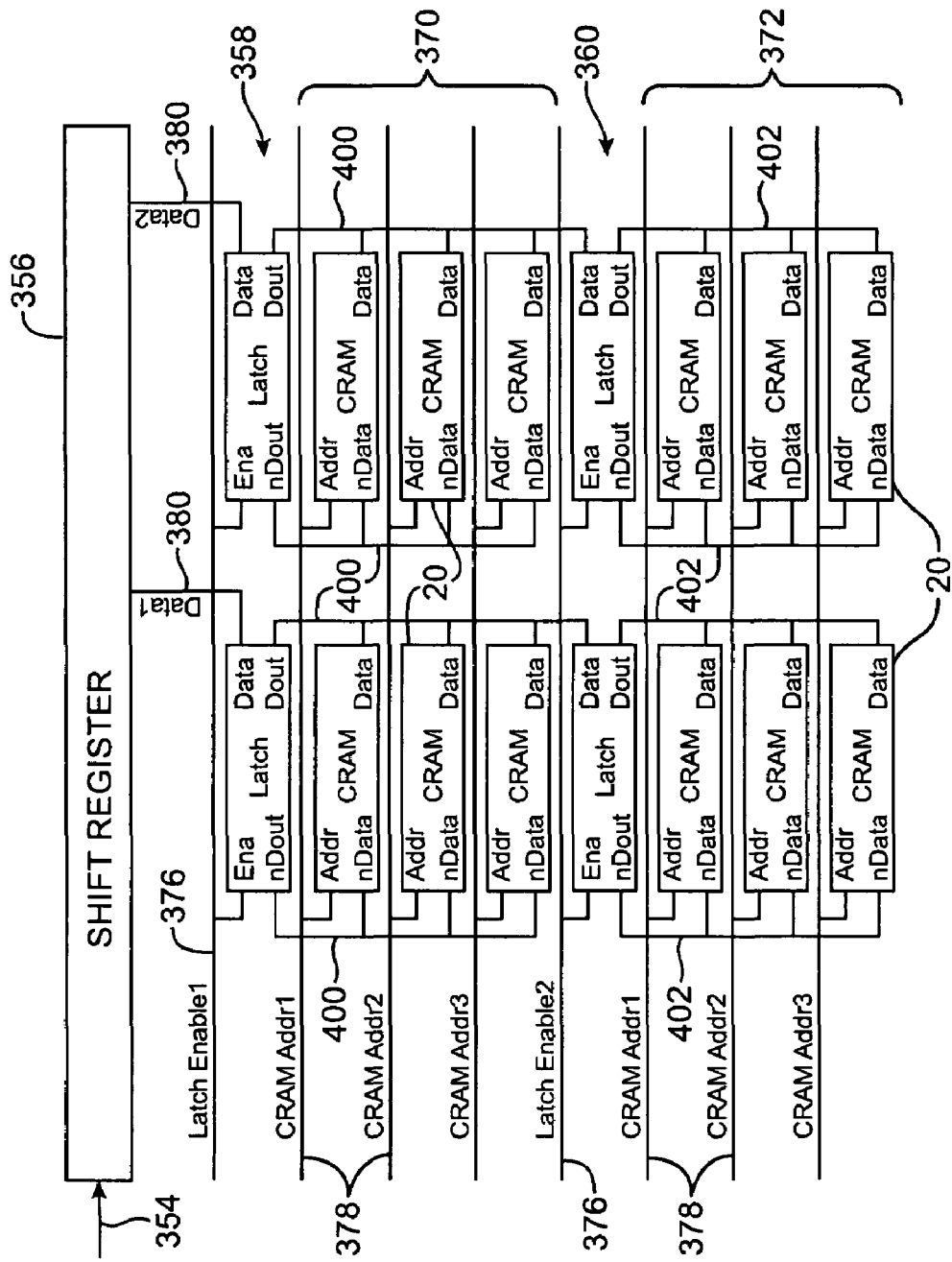
FIG. 48 is a diagram of illustrative circuitry that may be used to load an array of memory elements by passing loaded data through chained latches in accordance with the present invention.

In the arrangement of FIG. 46, data lines (DATA1 and DATA2) extend the entire length of each column of memory elements in the memory array. FIG. 48 shows a data loading arrangement that uses a different architecture. As shown in FIG. 48, data lines 380 extend between shift register 356 and the set of latches 358 that are associated with the first bank of memory elements (bank 370). The sets of latches in each bank are chained together using local data lines 400 and 402. During memory element loading operations, local data lines 400 are used to convey configuration data from latches 358 to memory elements in bank 370 and local data lines 402 are used to convey configuration data from latches 360 to memory elements in bank 372. During latch loading operations, local data lines (such as lines 400 in the example of FIG. 4) can be used to form a chain of latches, which are loaded in series.

Figure 49:
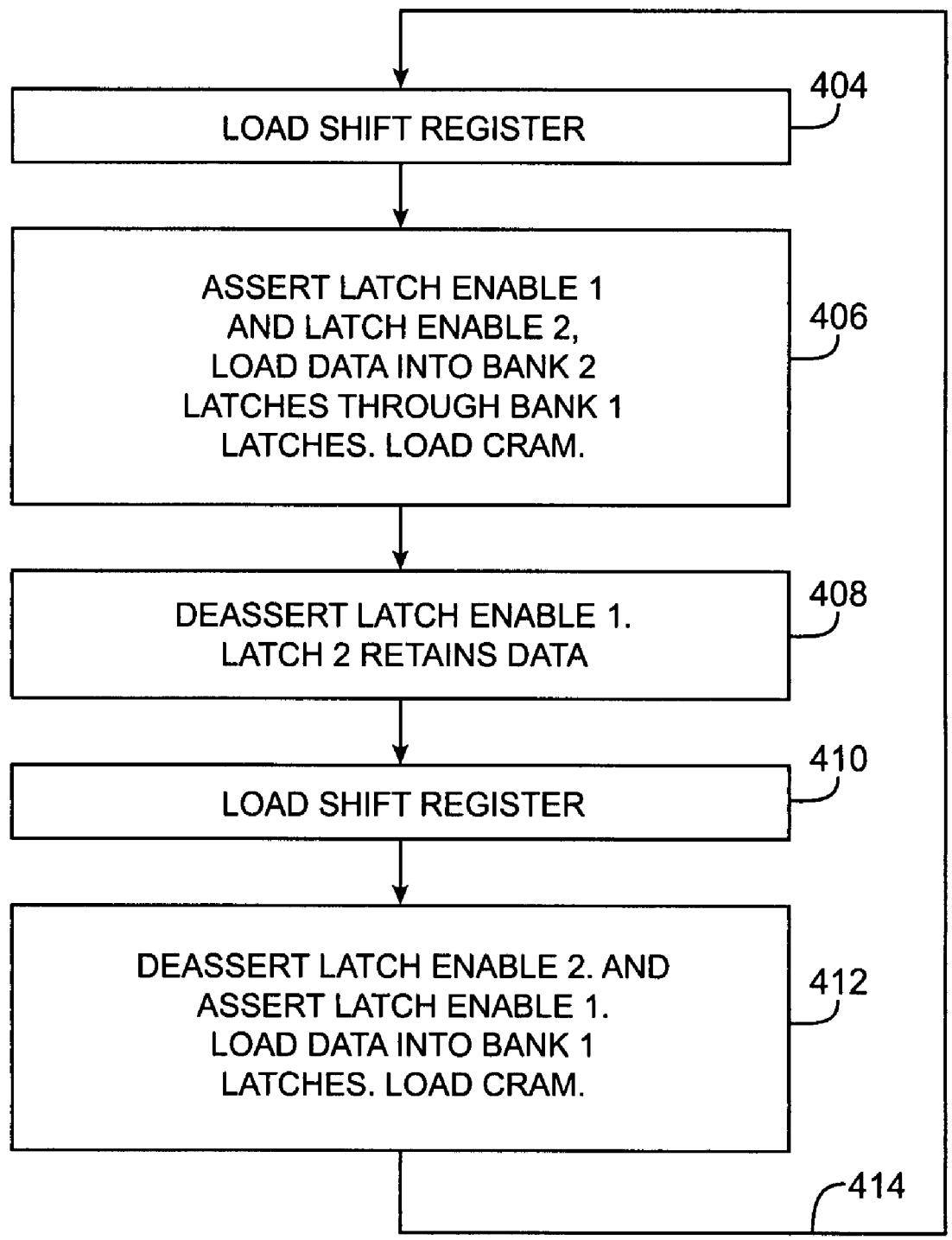
FIG. 49 is a flow chart of illustrative steps involved in loading a memory array of the type shown in FIG. 48 in accordance with the present invention.

Illustrative steps involved in loading configuration data into the memory elements 20 using circuitry of the type shown in FIG. 48 are shown in FIG. 49.

At step 404, the shift register and control circuitry 356 is loaded with configuration data via path 354.

At step 406, LATCH ENABLE 1 and LATCH ENABLE 2 are asserted. Data is loaded into the bank 2 latches (i.e., the latches 360 that are associated with bank 372 in FIG. 48) through the bank 1 latches (i.e., through the latches 358 that are associated with the memory elements of bank 370 in FIG. 48). The memory elements in bank 372 are loaded with the configuration data that has been provided to the latches 360.

At step 408, LATCH ENABLE 1 is deasserted to decouple latches 358 from the shift register 356.

At step 410, the shift register 356 is loaded with configuration data for latches 358.

At step 412, LATCH ENABLE 2 is deasserted and LATCH ENABLE 1 is asserted. The configuration data that was loaded into the shift register 356 at step 410 is then transferred into latches 358. The memory elements in bank 370 are loaded with the configuration data that has been provided to the latches 358.

As indicated by line 414, the process repeats until all memory elements 20 have been loaded. During each loop, a different row of memory elements in each bank is addressed and loaded.

Figure 50:
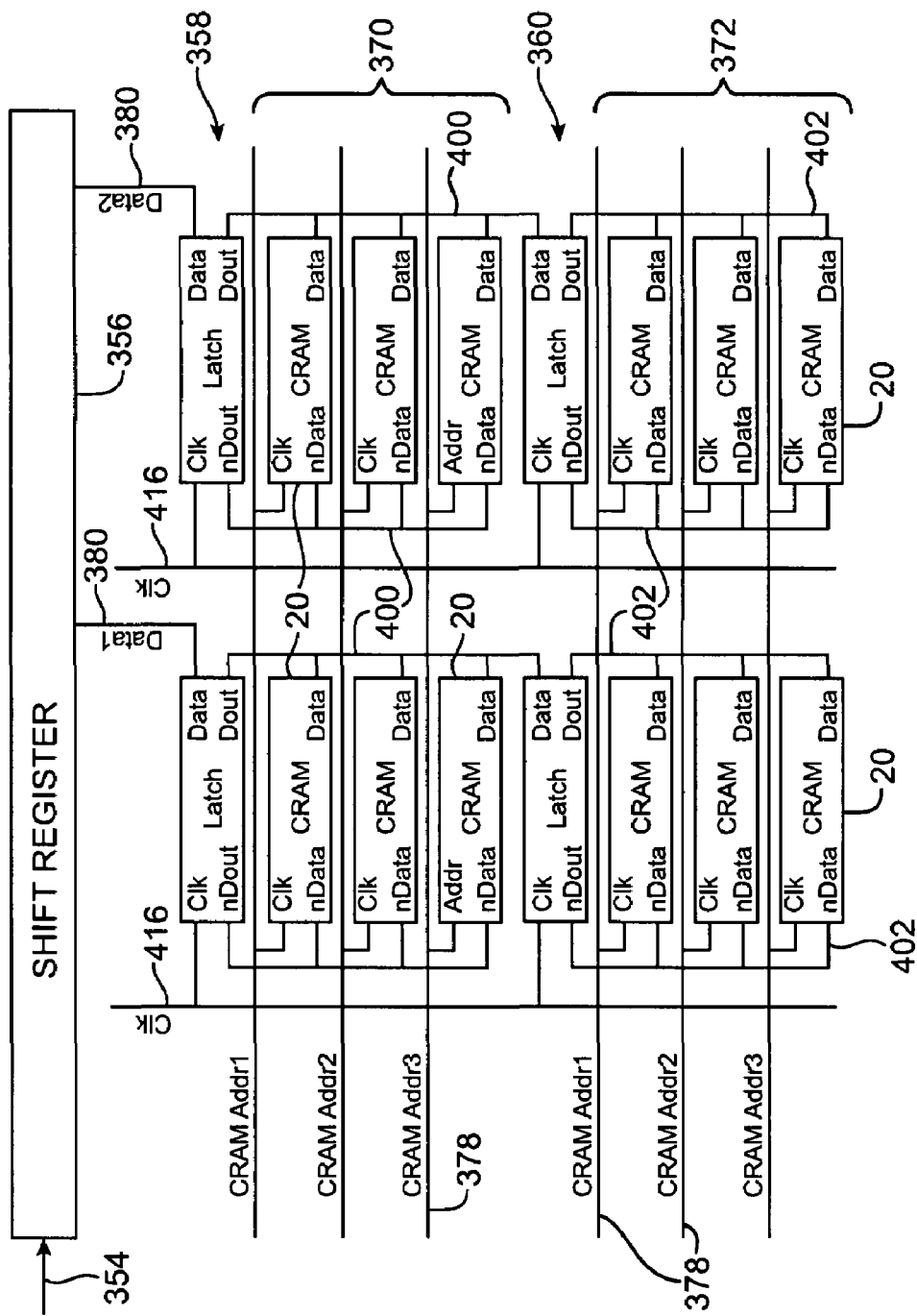
FIG. 50 is a diagram of illustrative circuitry that may be used to load an array of memory elements by serially clocking data through chained latches without using latch enables in accordance with the present invention.

Another suitable configuration data loading circuit for the memory elements 20 is shown in FIG. 50. As with the arrangement of FIG. 48, the arrangement of FIG. 50 uses local data lines 400 and 402 to distribute data through a chain of latches. However, latches 358 and 360 in FIG. 50 are addressed using a clocking scheme rather than latch enable lines. Data lines 380 connect shift register 356 and the set of latches 358 that are associated with the first bank of memory elements (bank 370). The latches in each bank are chained together using local data lines 400 and 402.

During latch loading operations, local data lines 400 allow data to flow to latches 360 through latches 358 as clock signals are applied on clock line 416. During memory element loading, local data lines 400 are used to convey configuration data from latches 358 to memory elements in bank 370. Local data lines 402 are used to convey configuration data from latches 360 to memory elements in bank 372.

Figure 51:
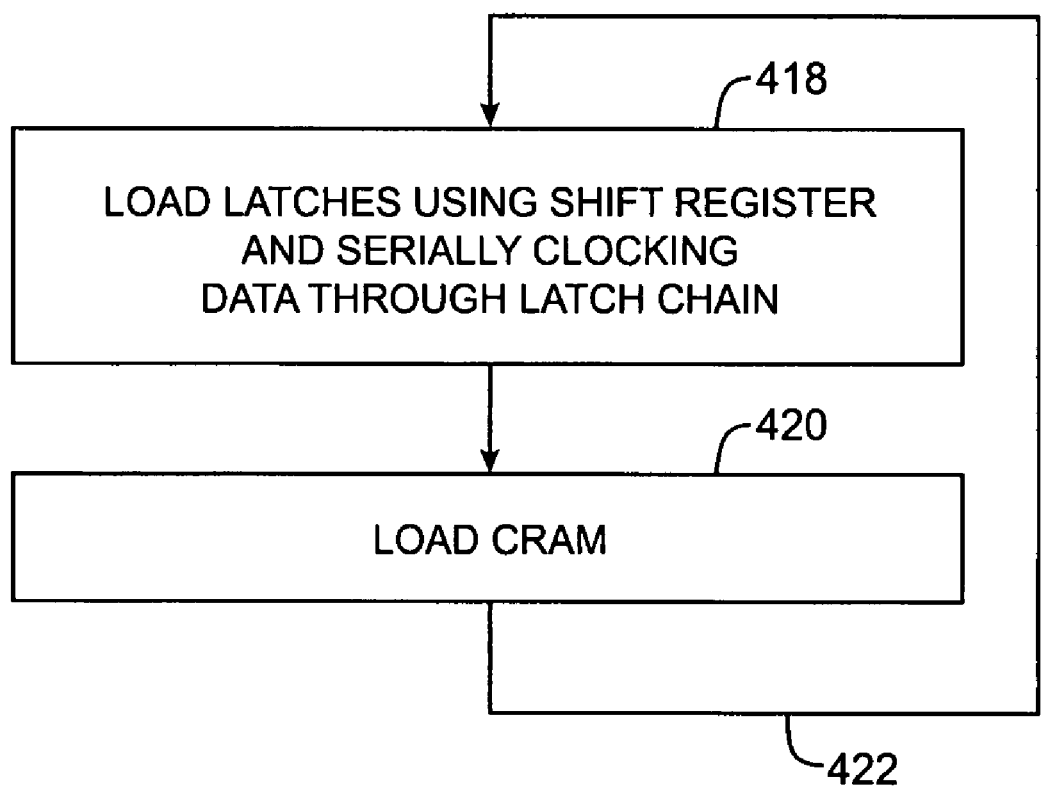
FIG. 51 is a flow chart of illustrative steps involved in loading a memory array of the type shown in FIG. 50 in accordance with the present invention.

Illustrative steps involved in loading the memory elements 20 of FIG. 50 are shown in FIG. 51.

At step 418, latches 358 and 360 are loaded with configuration data from shift register 356. The clock signal on clock lines 416 is used to clock the latches 358 and 360 during the transfer process. Configuration data flows along paths 380 to latches 358 and along paths 400 from latches 358 to latches 360. The example of FIG. 50 uses two banks of memory elements. If more banks of memory elements and more sets of associated latches were used, data would be provided to those additional latches in the same way through data lines 402, etc.

After all of the configuration data has been loaded into the latches, the memory elements are loaded at step 420. During step 420, address lines in each bank are asserted, so that the configuration data is loaded from the latches into the desired row of memory elements in each bank. Because multiple sets of latches are used in parallel during data loading, the loading process proceeds more rapidly than if data were loaded only from shift register 356.

As shown by line 422, the loading process continues until each of the rows of the memory elements 20 have been loaded. During each pass through steps 418 and 420, a different row of memory elements in each bank is loaded by asserting appropriate address lines 378.

The foregoing is merely illustrative of the principles of this invention and various modifications can be made by those skilled in the art without departing from the scope and spirit of the invention.

What is claimed is:

1. An integrated circuit memory element with immunity to soft error upset events, comprising:
    first and second cross-coupled inverters each having an input and an output and each having two transistors with gates; and
    at least one nonlinear high-impedance two-terminal element having a first terminal connected to the output of the second inverter and a second terminal connected to at least one of the gates of the first inverter, wherein the nonlinear high-impedance two-terminal element comprises a p-n junction diode having doped n-type polysilicon and doped p-type polysilicon.

2. The integrated circuit memory element defined in claim 1 wherein the nonlinear high-impedance two-terminal element comprises a single diode.

3. The integrated circuit memory element defined in claim 1 wherein the nonlinear high-impedance two-terminal element comprises two back-to-back diodes.

4. The integrated circuit memory element defined in claim 1 wherein the nonlinear high-impedance two-terminal element comprises at least one Schottky diode.

5. The integrated circuit memory element defined in claim 1 wherein the nonlinear high-impedance two-terminal element comprises doped polysilicon and undoped polysilicon.

6. The integrated circuit memory element defined in claim 1 wherein the n-type polysilicon and p-type polysilicon form a p-n junction, wherein at least some of the n-type and p-type polysilicon is covered with a layer of silicide, and wherein there is a gap in the layer of silicide above the p-n junction.

7. The integrated circuit memory element defined in claim 1 wherein the nonlinear high-impedance two-terminal element is located adjacent to one of the transistor gates in the first inverter.

8. The integrated circuit memory element defined in claim 1 wherein the nonlinear high-impedance two-terminal element is located adjacent to the output of the second inverter.

9. The integrated circuit memory element defined in claim 1 wherein the two transistors in each inverter comprise a n-channel metal-oxide-semiconductor transistor and a p-channel metal-oxide-semiconductor transistor, wherein in each inverter the gate of the n-channel metal-oxide-semiconductor transistor is connected to the gate of the p-channel metal-oxide-semiconductor transistor at the input to that inverter, and wherein there are two of the nonlinear high-impedance two-terminal elements a first of which is connected between the output of the second inverter and the input of the first inverter and the second of which is connected between the output of the first inverter and the input of the second inverter.

10. A memory element on a programmable logic device integrated circuit comprising:
   first and second cross-coupled inverters that store configuration data for the programmable logic device integrated circuit, wherein each inverter includes a p-channel metal-oxide-semiconductor transistor and an n-channel metal-oxide-semiconductor transistor each of which has a transistor gate; and
   at least one nonlinear high-impedance two-terminal element that is electrically connected to at least one of the transistor gates to make the memory element immune to soft error upset events due to atomic particle strikes, wherein each inverter has an output and an input and wherein there are at least first and second nonlinear high-impedance two-terminal elements, wherein the first nonlinear high-impedance two-terminal element has a first terminal connected to the output of the first inverter and a second terminal connected to the input of the second inverter, wherein the second nonlinear high-impedance two-terminal element has a first terminal connected to the output of the second inverter and a second terminal connected to the input of the first inverter, and wherein the first and second nonlinear high-impedance two-terminal elements are formed from n-type and p-type polysilicon.

11. The memory element defined in claim 10 wherein the first nonlinear high-impedance two-terminal element comprises at least two back-to-back diodes connected in a common anode configuration.

12. A programmable logic device integrated circuit containing programmable logic that is configured by loading configuration data into the programmable logic device integrated circuit, comprising:
   an array of memory elements each of which includes at least one nonlinear high-impedance two-terminal element that provides the memory element with immunity to soft error upset events, wherein the array of memory elements is arranged in a plurality of banks;
   a plurality of sets of latches each associated with a respective one of the plurality of banks of memory elements, wherein each set of latches loads configuration data into its respective bank of memory elements; and
   circuitry that receives the configuration data for configuring the programmable logic and that provides the configuration data to the sets of latches, wherein at least some of the sets of latches load their respective banks of memory elements at the same time.

13. The programmable logic device integrated circuit defined in claim 12 wherein the circuitry comprises a serially-loaded shift register that sequentially loads the sets of latches with the configuration data in parallel, so that while at least one of the sets of latches is receiving configuration data from the shift register, other sets of latches are loading their configuration data into their respective banks of memory elements.

14. The programmable logic device integrated circuit defined in claim 12 wherein the circuitry comprises a serially-loaded shift register that provides the configuration data to the latches in each set in parallel, wherein each set of latches has an associated latch enable, and wherein the configuration data is loaded from the shift register into the sets of latches by successively enabling each set of latches using its associated latch enable.

15. The programmable logic device integrated circuit defined in claim 12 wherein the circuitry comprises a serially-loaded shift register that provides the configuration data to at least one of the sets of latches in parallel, wherein the sets of latches are connected to form a chain of sets, so that configuration data from the shift register is provided to the sets of latches through the chain.

* * * * *